(12) United States Patent
Inoue et al.

(10) Patent No.: US 9,117,961 B2
(45) Date of Patent: Aug. 25, 2015

(54) NITRIDE-BASED SEMICONDUCTOR LIGHT-EMITTING ELEMENT

(71) Applicant: Panasonic Corporation, Osaka (JP)

(72) Inventors: Akira Inoue, Osaka (JP); Masaki Fujikane, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 32 days.

(21) Appl. No.: 13/778,727

(22) Filed: Feb. 27, 2013

(65) Prior Publication Data

US 2013/0175566 A1 Jul. 11, 2013

Related U.S. Application Data

(63) Continuation of application No. PCT/JP2012/002385, filed on Apr. 5, 2012.

(30) Foreign Application Priority Data

Jul. 14, 2011 (JP) ................................. 2011-155684

(51) Int. Cl.
*H01L 33/00* (2010.01)
*H01L 33/18* (2010.01)
(Continued)

(52) U.S. Cl.
CPC ............ *H01L 33/18* (2013.01); *H01L 33/0075* (2013.01); *H01L 33/20* (2013.01); *H01L 33/0095* (2013.01); *H01L 33/32* (2013.01)

(58) Field of Classification Search
CPC ..... H01L 33/18; H01L 33/0095; H01L 33/20; H01L 33/32; H01L 33/0075

USPC .................................................... 257/98, 103
See application file for complete search history.

(56) References Cited

U.S. PATENT DOCUMENTS

| 6,404,125 B1 * | 6/2002 | Garbuzov et al. ............. 313/499 |
| 2002/0063258 A1 | 5/2002 | Motoki |
| 2002/0093023 A1 | 7/2002 | Camras et al. |
| 2004/0026700 A1 | 2/2004 | Akaike et al. |

(Continued)

FOREIGN PATENT DOCUMENTS

| EP | 1 331 673 A1 | 7/2003 |
| JP | 10-326910 A | 12/1998 |

(Continued)

OTHER PUBLICATIONS

International Search Report for corresponding International Application No. PCT/JP2012/002385 mailed Jun. 5, 2012.

(Continued)

*Primary Examiner* — Tran Tran
(74) *Attorney, Agent, or Firm* — Renner, Otto, Boisselle & Sklar, LLP

(57) ABSTRACT

A nitride-based semiconductor light-emitting element includes a substrate and a nitride semiconductor multilayer structure. The nitride semiconductor multilayer structure includes a nitride semiconductor active layer which emits polarized light. Angle θ, which is formed by at least one of the plurality of lateral surfaces of the substrate with respect to the principal surface of the substrate, is greater than 90°. Angle θ2 (mod 180°), which is an absolute value of an angle which is formed by an intersecting line of at least one of the plurality of lateral surfaces of the substrate and the principal surface of the substrate with respect to a polarization direction in the principal surface of the polarized light, is an angle which does not include 0° or 90°.

18 Claims, 34 Drawing Sheets

(51) Int. Cl.
  *H01L 33/20* (2010.01)
  *H01L 33/32* (2010.01)

(56) References Cited

U.S. PATENT DOCUMENTS

| | | |
|---|---|---|
| 2006/0278886 A1 | 12/2006 | Tomoda et al. |
| 2008/0258156 A1 | 10/2008 | Hata |
| 2009/0101925 A1 | 4/2009 | Shakuda |
| 2009/0101936 A1 | 4/2009 | Kamei et al. |
| 2009/0283760 A1 | 11/2009 | Fujii |

FOREIGN PATENT DOCUMENTS

| | | |
|---|---|---|
| JP | 11-340576 A | 12/1999 |
| JP | 2003-298107 A | 10/2003 |
| JP | 2006-203058 A | 8/2006 |
| JP | 2007-234908 A | 9/2007 |
| JP | 2008-109098 A | 5/2008 |
| JP | 2008-277323 A | 11/2008 |
| JP | 2009-071174 A | 4/2009 |
| JP | 2009-123803 A | 6/2009 |
| JP | 2009-239075 A | 10/2009 |
| WO | 2011/007816 A1 | 1/2011 |

OTHER PUBLICATIONS

Extended European Search Report issued on Oct. 30, 2014 for corresponding European Application No. EP 12 81 1840.

* cited by examiner (11-22) plane

LINEAR POLARIZATION   CIRCULAR POLARIZATION   ELLIPTICAL POLARIZATION

♦: WITHOUT RECESSES AND ELEVATIONS ACROSS LIGHT EXTRACTION SURFACE 331
□: WITH RECESSES AND ELEVATIONS ACROSS LIGHT EXTRACTION SURFACE 331
△: WITH HEMISPHERICAL ELEVATED PORTIONS ACROSS LIGHT EXTRACTION SURFACE 331

NITRIDE-BASED SEMICONDUCTOR LIGHT-EMITTING ELEMENT

This is a continuation of International Application No. PCT/JP2012/002385, with an international filing date of Apr. 5, 2012, which claims priority of Japanese Patent Application No. 2011-155684, filed on Jul. 14, 2011, the contents of which are hereby incorporated by reference.

BACKGROUND

1. Technical Field

The present application relates to a nitride-based semiconductor light-emitting element which includes a substrate which has a principal surface, a rear surface that is a light extraction surface, and a plurality of lateral surfaces, and a nitride semiconductor multilayer structure formed on the principal surface of the substrate. The present application also relates to a light source which includes a nitride-based semiconductor light-emitting element and to a method for manufacturing a nitride-based semiconductor light-emitting element.

2. Description of the Related Art

A nitride semiconductor containing nitrogen (N) as a Group V element is a prime candidate for a material to make a short-wave light-emitting device, because its bandgap is sufficiently wide. Among other things; gallium nitride-based compound semiconductors have been researched and developed particularly extensively. As a result, blue light-emitting diodes (LEDs), green LEDs, and blue semiconductor laser diodes in which gallium nitride-based compound semiconductors are used have already been used in actual products.

Hereinafter, the nitride semiconductors include a compound semiconductor in which some or all of gallium (Ga) atoms are replaced with at least one of aluminum (Al) and indium (In) atoms. Therefore, the nitride semiconductors are represented by formula $Al_xGa_yIn_zN$ ($0 \leq x, y, z \leq 1$, $x+y+z=1$).

By replacing Ga atoms with Al or In atoms, the bandgap can be greater than that of GaN. By replacing Ga atoms with In atoms, the bandgap can be smaller than that of GaN. This enables not only emission of short-wave light, such as blue light or green light, but also emission of orange light or red light. Because of such a feature, a nitride-based semiconductor light-emitting element has been expected to be applied to image display devices and lighting devices.

The nitride semiconductor has a wurtzite crystal structure. FIG. 1A to FIG. 1C show planes of a wurtzite crystal structure with four characters (hexagonal indices). In a four-character expression, crystal planes and orientations are expressed using primitive vectors of a1, a2, a3, and c. The primitive vector c runs in the [0001] direction, which is called a "c-axis". A plane that intersects with the c-axis at right angles is called either a "c-plane" or a "(0001) plane". FIG. 1A shows c-plane as well as a-plane and m-plane. FIG. 1B shows r-plane. FIG. 1C shows (11-22) plane.

FIG. 2A shows a molecular orbital model of the crystal structure of the nitride semiconductor. FIG. 2B is a diagram showing an atomic arrangement near an m-plane surface, which is observed from the a-axis direction. The m-plane is perpendicular to the drawing sheet of FIG. 2B. FIG. 2C is a diagram showing an atomic arrangement at a +c-plane surface, which is observed from the m-axis direction. The c-plane is perpendicular to the drawing sheet of FIG. 2C. As seen from FIG. 2B, N atoms and Ga atoms reside at a plane which is parallel to the m-plane. On the other hand, as seen from FIG. 2C, the c-plane includes layers in which only Ga atoms reside and layers in which only N atoms reside.

According to the conventional techniques, in fabricating a semiconductor element using nitride semiconductors, a c-plane substrate, i.e., a substrate which has a (0001)-plane principal surface, is used as a substrate on which nitride semiconductor crystals are to be grown. In this case, due to the arrangement of Ga atoms and N atoms, spontaneous electrical polarization is produced in the c-axis direction in the nitride semiconductor. That is why the c-plane is also called a "polar plane". As a result of the electrical polarization, a piezoelectric field is generated along the c-axis direction in the InGaN quantum well in the active layer of the nitride-based semiconductor light-emitting element. This electric field causes some positional deviation in the distributions of electrons and holes in the active layer, so that the internal quantum yield decreases due to the quantum confinement Stark effect of carriers.

Thus, it has been proposed that a substrate of which the principal surface is a so-called "non-polar plane", such as m-plane or a-plane, or a so-called "semi-polar plane", such as −r plane or (11-22) plane, be used. As shown in FIG. 1, the m-planes in the wurtzite crystal structure are parallel to the c-axis and are six equivalent planes which intersect with the c-plane at right angles. For example, in FIG. 1A, the (1-100) plane that is perpendicular to the [1-100] direction is the m-plane. The other m-planes which are equivalent to the (1-100) plane include (−1010) plane, (10-10) plane, (−1100) plane, (01-10) plane, and (0-110) plane. Here, "−" attached on the left-hand side of a Miller-Bravais index in the parentheses means a "bar", which conveniently represents inversion of that index.

On the m-plane, as shown in FIG. 2(b), Ga atoms and N atoms are on the same atomic-plane. For that reason, no electrical polarization will be produced perpendicularly to the m-plane. Therefore, if a light-emitting element is fabricated using a semiconductor multilayer structure which has been formed on the m-plane, no piezoelectric field will be generated in the active layer, thus overcoming the problem that the internal quantum yield is decreased due to the quantum confinement Stark effect of carriers. This also applies to the a-plane that is one of the other non-polar planes than the m-plane. Also, similar effects can be achieved even in the case of a so-called semi-polar plane, such as −r plane or (11-22) plane.

Further, a nitride-based semiconductor light-emitting element including an active layer which is formed on the m-plane, the a-plane, the −r plane or the (11-22) plane has a polarization characteristic which is attributed to the structure of its valence band.

For example, Japanese Laid-Open Patent Publication No. 2009-71174 (hereinafter, referred to as "Patent Document 1") discloses, as a method for improving the polarization characteristic of a nitride-based semiconductor light-emitting element whose principal surface is a non-polar plane or a semi-polar plane, separating nitride-based semiconductor light-emitting elements into small chips each having a rhombic shape or a triangular shape, so that a resultant configuration prevents decrease of the polarization degree of light outgoing from a lateral surface of the nitride-based semiconductor light-emitting element.

For example, Japanese Laid-Open Patent Publication No. 2007-234908 (hereinafter, referred to as "Patent Document 2") discloses, as a method for improving the reliability of a nitride-based semiconductor light-emitting element, isolating M-plane or R-plane nitride-based semiconductor light-emitting elements into nitride semiconductor chips in such a manner that the isolation is carried out with an inclination of 30 to 60 degrees with respect to a cleavage surface.

For example, Japanese Laid-Open Patent Publication No. 2008-277323 (hereinafter, referred to as "Patent Document 3") discloses, as a method for improving light extraction from a nitride-based semiconductor light-emitting element having an a-plane principal surface, isolating nitride semiconductor chips in such a manner that the isolation is carried out with an inclination of 5 to 85 degrees with respect to a cleavage surface. This leads to generation of recesses and elevations across a lateral surface of the nitride semiconductor chip, so that light extraction from the lateral surface improves.

SUMMARY

In the above-described conventional techniques, further improvement of the light emission quality has been demanded.

One of the major objects of the present invention is to provide a nitride-based semiconductor light-emitting device having improved light emission quality.

A nitride-based semiconductor light-emitting element of one embodiment is a nitride-based semiconductor light-emitting element which includes a substrate which has a principal surface, a rear surface that is a light extraction surface, and a plurality of lateral surfaces, and a nitride semiconductor multilayer structure formed on the principal surface of the substrate, wherein the nitride semiconductor multilayer structure includes an active layer which emits polarized light, angle θ is greater than 90°, and angle θ2 (mod 180°) is an angle which does not include 0° or 90°, where the angle θ is an angle which is formed by at least one of the plurality of lateral surfaces of the substrate with respect to the principal surface of the substrate, and the angle θ2 is an absolute value of an angle which is formed by an intersecting line of at least one of the plurality of lateral surfaces of the substrate and the principal surface of the substrate with respect to a polarization direction in the principal surface of the polarized light.

According to the above aspect, θ is greater than 90°, and θ2 is an angle which does not include 0° or 90°. Therefore, part of polarized light emitted from a nitride semiconductor active layer is converted to elliptical polarization and reflected at a lateral surface of a substrate and then can be extracted from the rear surface. As a result, the polarization degree can be reduced, and the emission quality can be improved.

These general and specific aspects may be implemented using a system, a method and any combination of systems and methods.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1A:
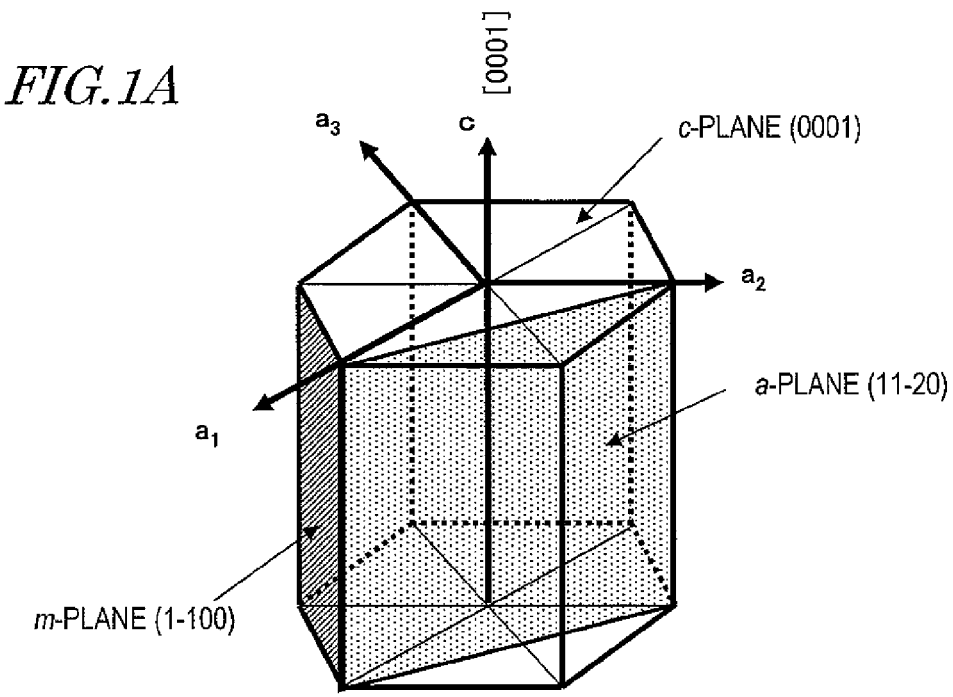
FIG. 1A is a diagram showing a c-plane, an a-plane, and an m-plane of a wurtzite crystal structure.
Figure 1B:
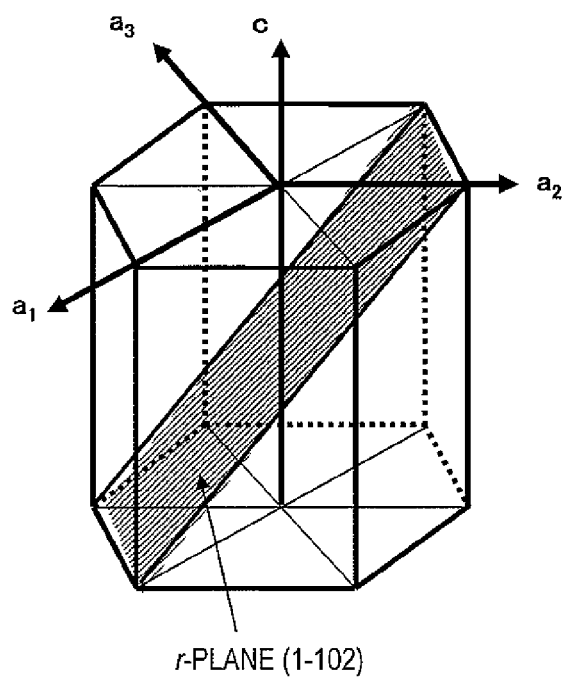
FIG. 1B is a diagram showing an r-plane of wurtzite crystal structure.
Figure 1C:
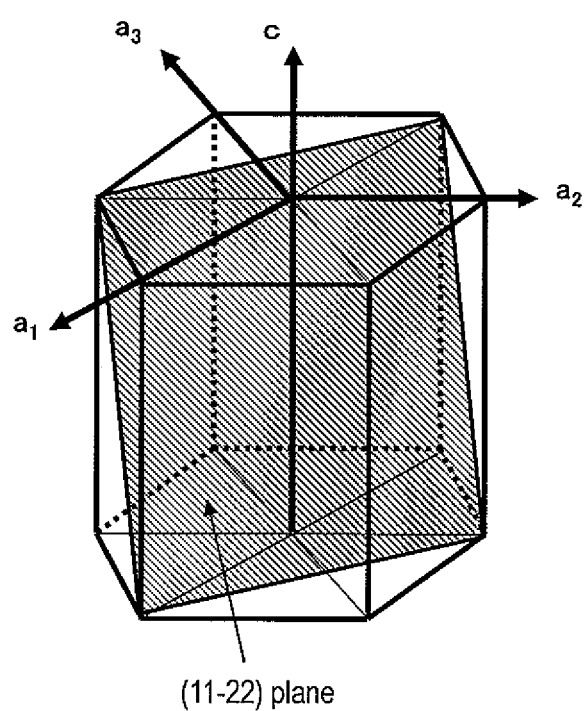
FIG. 1C is a diagram showing a (11-22) plane of a wurtzite crystal structure.
Figure 2A:
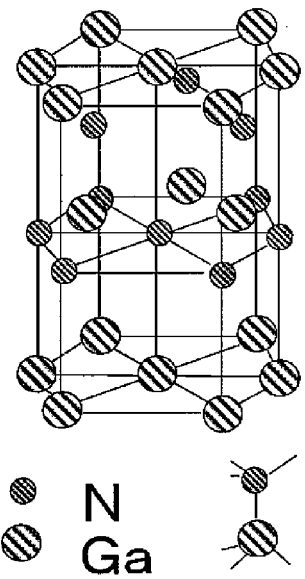
FIG. 2A is a diagram showing the crystal structure of a nitride semiconductor using a molecular orbital model.
Figure 2B:
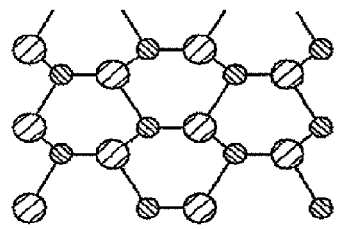
FIG. 2B is a diagram showing an atomic arrangement near an m-plane surface, which is observed from the a-axis direction.
Figure 2C:
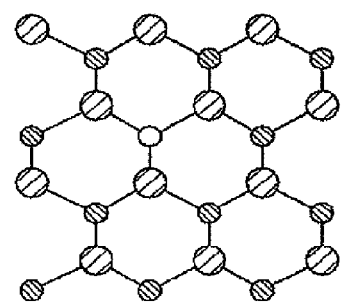
FIG. 2C is a diagram showing an atomic arrangement near a +c plane surface, which is observed from the m-axis direction.

One embodiment of the present invention is a nitride-based semiconductor light-emitting element including a substrate which has a principal surface, a rear surface that is a light extraction surface, and a plurality of lateral surfaces, and a nitride semiconductor multilayer structure formed on the principal surface of the substrate, wherein the nitride semiconductor multilayer structure includes an active layer which emits polarized light, angle θ is greater than 90°, and angle θ2 (mod 180°) is an angle which does not include 0° or 90°, where the angle θ is an angle which is formed by at least one of the plurality of lateral surfaces of the substrate with respect to the principal surface of the substrate, and the angle θ2 is an absolute value of an angle which is formed by an intersecting line of at least one of the plurality of lateral surfaces of the substrate and the principal surface of the substrate with respect to a polarization direction in the principal surface of the polarized light.

The above configuration enables reduction of the polarization degree and improvement of the emission quality.

The substrate may be an off-cut substrate of not more than 5°.

A value of (θ−90°) may be not less than a value of the angle θ1 which satisfies Formula 9:

$$\theta 1 = 51.0 - 21.5 \times n2 \quad \text{(Formula 9)}$$

The value of (θ−90°) may be greater than critical angle θc which is determined by refractive indices n1 and n2, where n1 is a refractive index for light of the substrate and n2 is a refractive index of a medium which is in contact with the plurality of lateral surfaces of the substrate.

A planar shape of the principal surface and the rear surface of the substrate may be a quadrangular shape, and the plurality of lateral surfaces may be four lateral surfaces.

A planar shape of the principal surface and the rear surface of the substrate may be any of a parallelogrammatic shape, a square shape, a rectangular shape, and a rhombic shape.

The angle θ2 (mod 90°) may be not less than 25° and not more than 65°, may be not less than 35° and not more than 55°, or may be not less than 40° and not more than 50°.

The rear surface of the substrate may have a plurality of elevated portions.

The elevated portions may have a conical shape or a hemispherical shape and may be two-dimensionally arranged across the rear surface of the substrate.

The elevated portions may have a striped shape, and γ (mod 180°) may be not less than 5° and not more than 175° or may be not less than 30° and not more than 150° where γ is an absolute value of an angle which is formed between an extending direction of the striped shape and a polarization direction of the polarized light.

σ1 (mod 180°) may be not less than 85° and not more than 95° where σ1 is an absolute value of an angle which is formed between a polarization direction of the polarized light and a normal line of the principal surface of the substrate, and σ2 (mod 180°) may be not less than 85° and not more than 95° where σ2 is an absolute value of an angle which is formed between the polarization direction of the polarized light and a normal line of the rear surface of the substrate.

A light source of one embodiment of the present invention includes a nitride-based semiconductor light-emitting element of one embodiment and a wavelength converter including a phosphor that converts at least a wavelength of light emitted from the rear surface of the substrate.

A nitride-based semiconductor element manufacturing method of one embodiment of the present invention is a nitride-based semiconductor element manufacturing method including the steps of: (a) providing a substrate which has a principal surface and a rear surface that is a light extraction surface; (b) forming a nitride semiconductor multilayer structure on the principal surface of the substrate; and (c) cutting the substrate and the nitride semiconductor multilayer structure into a plurality of nitride-based semiconductor elements, wherein the nitride semiconductor multilayer structure includes an active layer which emits polarized light, and step (c) includes cutting the substrate and the nitride semiconductor multilayer structure such that angle θ is greater than 90°, and angle θ2 is an angle which does not include 0° or 90°, where the angle θ is an angle which is formed by at least one of the plurality of lateral surfaces of the substrate with respect to the principal surface of the substrate and the angle θ2 is an absolute value of an angle which is formed by an intersecting line of at least one of the plurality of lateral surfaces of the substrate and the principal surface of the substrate with respect to a polarization direction in the principal surface of the polarized light.

The substrate provided in step (a) may be an off-cut substrate of not more than 5°.

A value of (θ−90°) may be not less than a value of the angle θ1 which satisfies Formula 9:

$$\theta 1=51.0-21.5\times n2 \quad \text{(Formula 9)}$$

σ1 (mod 180°) may be not less than 85° and not more than 95° where σ1 is an absolute value of an angle which is formed between a polarization direction of the polarized light and a normal line of the principal surface of the substrate, and σ2 (mod 180°) may be not less than 85° and not more than 95° where σ2 is an absolute value of an angle which is formed between the polarization direction of the polarized light and a normal line of the rear surface of the substrate.

Next, one considered aspect of the present embodiment is discussed. A nitride-based semiconductor light-emitting element including an active layer which is formed on the m-plane, a-plane, −r plane or (11-22) plane has a polarization characteristic which is attributed to the structure of its valence band. FIGS. 3(a) to 3(c) show an example of a nitride-based semiconductor light-emitting element manufactured on a substrate 304 which includes an en-plane GaN layer at its surface. FIG. 3(a) is a top view. FIG. 3(b) is a cross-sectional view taken along line X-X' of FIG. 3(a). FIG. 3(c) is a cross-sectional view taken along line Y-Y' of FIG. 3(a). The nitride-based semiconductor light-emitting element 300 includes a n-type nitride semiconductor layer 305 provided on the substrate 304, a nitride semiconductor active layer 306, a p-type nitride semiconductor layer 307, a p-side electrode 308 which is provided so as to be in contact with the p-type nitride semiconductor layer 307, and a n-side electrode 309 which is provided so as to be in contact with the n-type nitride semiconductor layer 305. A surface of a mounting base 301 is provided with a wire 302. The nitride-based semiconductor light-emitting element 300 and the wire 302 provided on the mounting base 301 are connected to each other via a bump 303. Light emitted from the nitride semiconductor active layer 306 is extracted from a light extraction surface 331 and four lateral surfaces 332 to the outside. Each lateral surface 332 is parallel to the c-plane or the a-plane of a nitride semiconductor crystal. Such a nitride semiconductor active layer formed on the m-plane mainly emits light whose electric field intensity is deviated in a direction parallel to the a-axis. A light-emitting element which has such a polarization characteristic is suitable when applied to a backlight for a liquid crystal display device, for example. However, when applied to decorative illumination or lighting purposes, the amount of reflection of light varies depending on the installation orientation. Therefore, the quality of the light-emitting element, when employed in such fields, deteriorates.

In this specification, light whose electric field intensity is deviated in a specific direction is referred to as "polarized light". For example, light whose electric field intensity is deviated in a direction parallel to X-axis is referred to as "X-axis direction polarized light". The direction parallel to the X-axis on this assumption is referred to as "polarization direction". Note that the "X-axis direction polarized light" not only means linearly-polarized light which is polarized in the X-axis direction but may include linearly-polarized light which is polarized in a different direction. More specifically, the "X-axis direction polarized light" means light in which the intensity (electric field intensity) of light transmitted through a "polarizer which has a polarization transmission axis extending in the X-axis direction" is higher than the electric field intensity of light transmitted through a polarizer which has a polarization transmission axis extending in a different direction. Therefore, the "X-axis direction polarized light" includes not only linearly-polarized light and elliptically-polarized light which are polarized in the X-axis direction but also a wide variety of non-coherent light in which linearly-polarized light and elliptically-polarized light which are polarized in various directions are mixed together.

The "polarization direction in a plane" refers to a direction resulting from projection of the polarization direction onto the plane.

While rotating the polarization transmission axis of the polarizer around the optical axis, the electric field intensity of light transmitted through the polarizer exhibits the strongest intensity, Imax, and the weakest intensity, Imin. The polarization degree is defined by the following formula:

$$|I\text{max}-I\text{min}|/|I\text{max}+I\text{min}|$$

In the case of the "X-axis direction polarized light", when the polarization transmission axis of the polarizer is parallel to the X-axis, the electric field intensity of the light transmitted through the polarizer is Imax. When the polarization transmission axis of the polarizer is parallel to the Y-axis, the electric field intensity of the light transmitted through the polarizer is Imin. In the case of perfectly linearly-polarized light, Imin=0, and therefore, the polarization degree is equal to 1. On the other hand, in the case of perfectly unpolarized light, Imax−Imin=0, and therefore, the polarization degree is equal to 0.

A nitride semiconductor light-emitting element which includes an active layer formed on the m-plane mainly emits the a-axis direction polarized light as described above. Meanwhile, it also emits the c-axis direction polarized light and the m-axis direction polarized light. However, the c-axis direction polarized light and the m-axis direction polarized light have weaker intensities than the a-axis direction polarized light.

Figure 3:
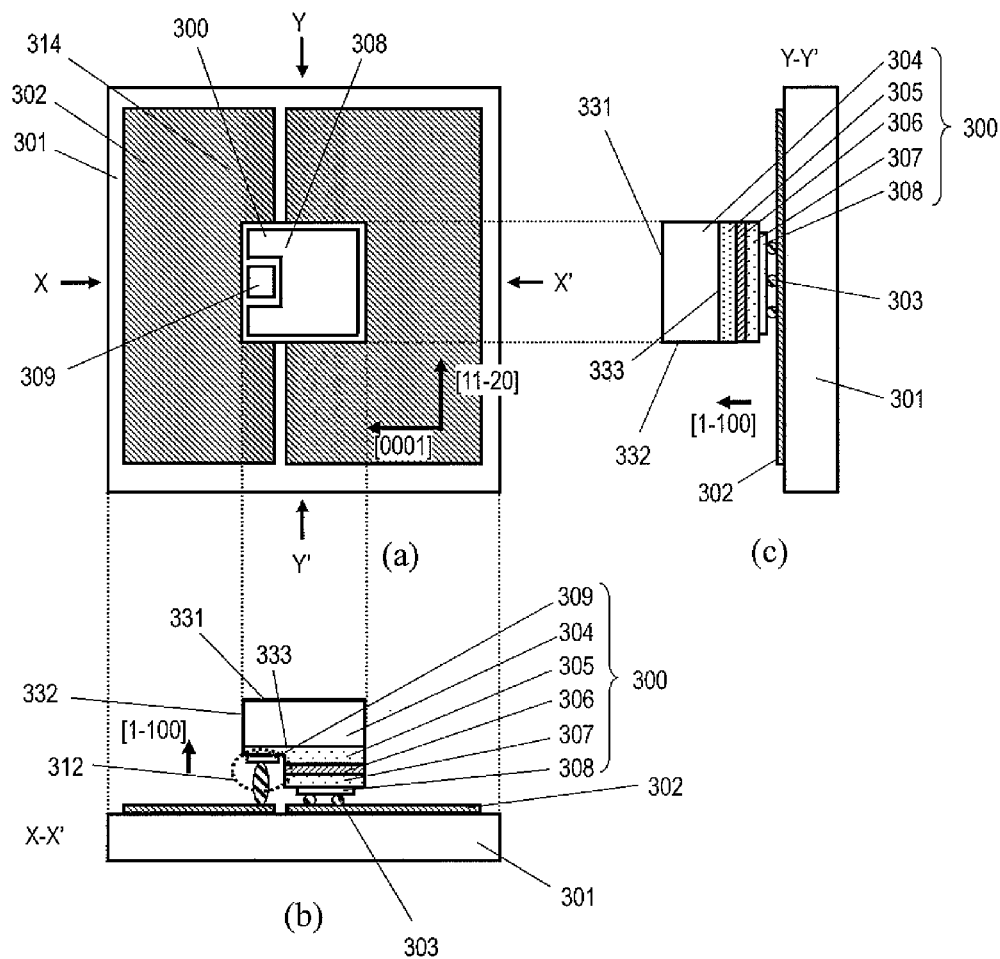
FIGS. 3(a) to 3(c) are diagrams showing a nitride-based semiconductor light-emitting element having an m-plane principal surface.
Figure 4:
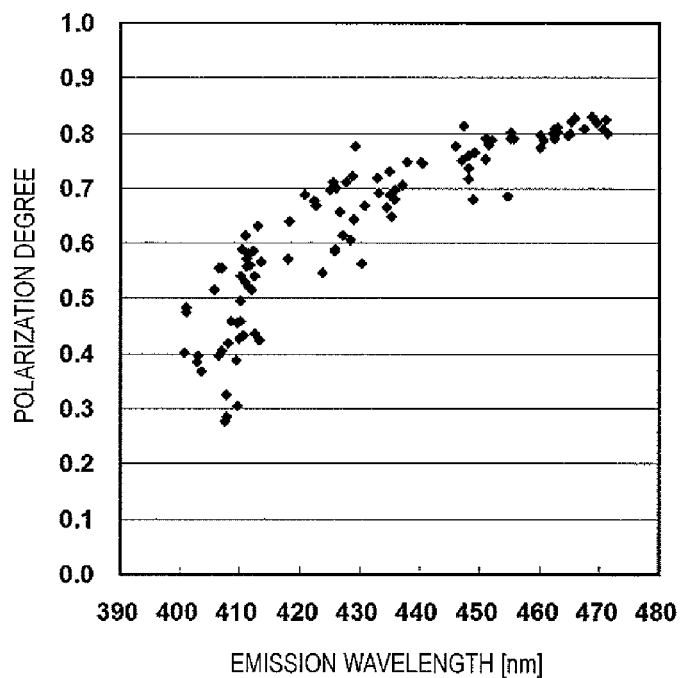
FIG. 4 is a graph showing measurement results of the emission wavelength and the polarization degree of a nitride-based semiconductor light-emitting element having an m-plane principal surface.
Figure 5:
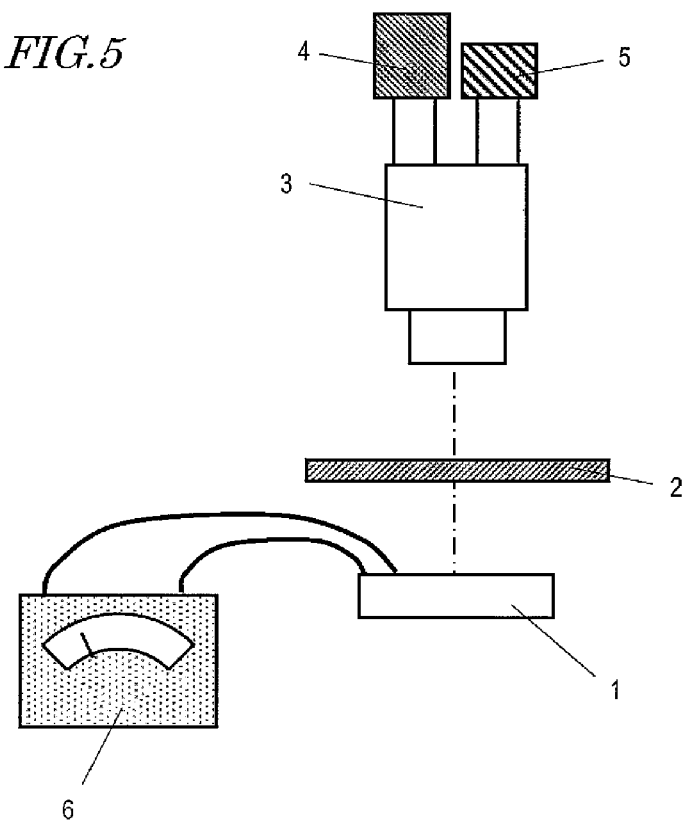
FIG. 5 is a diagram for illustrating a method for measuring the polarization degree.

The present inventors manufactured a nitride-based semiconductor light-emitting element including an active layer which was formed on the m-plane such as shown in FIG. 3. FIG. 4 is a graph showing measurement results of the emission wavelength and the polarization degree of the manufactured nitride-based semiconductor light-emitting element. The nitride semiconductor active layer 306 is made of InGaN. The emission wavelength is controlled by changing the mole fraction of In. The measurement of the polarization degree was carried out using an optical system shown in FIG. 5. Specifically, a LED 1 is powered by a power supply 6 to emit light. The emission of the LED 1 is checked using a stereoscopic microscope 3. The stereoscopic microscope 3 has two ports. A silicon photodetector 4 is attached to one of the ports, and a CCD camera is attached to the other. A polarizing plate 2 is provided between the stereoscopic microscope 3 and the LED 1. While rotating the polarizing plate 2, the maximum and the minimum of the emission intensity are measured using the silicon photodetector 4. As seen from FIG. 4, the configuration of FIG. 3 exhibits a polarization degree of about 0.3 to 0.8 depending on the emission wavelength. Since the polarization degree is greater than 0.1, it is difficult to employ the nitride-based semiconductor light-emitting element shown in FIG. 3 in existing applications without modification.

Patent Document 1 intends to maintain the polarization characteristic of a nitride-based semiconductor light-emitting element. However, when a light-emitting element which has a polarization characteristic is used as a light source, the amount of reflection at an object surface varies depending on the orientation of the polarization, i.e., the installation orientation of the LED, leading to a problem that the appearance of the object varies. This is because the P-polarized light and the S-polarized light exhibit different reflectances (the S-polarization has higher reflectance at the object surface). Here, the P-polarized light refers to light which has an electric field component that is parallel to the incidence plane. The S-polarized light refers to light which has an electric field component that is perpendicular to the incidence plane. In an application which utilizes the polarization characteristic without modification, improving the polarization degree is important. In common lighting applications, there is a problem that the polarization characteristic is a troublesome factor. Also, in Patent Document 1, the angle which is formed between a lateral surface and the principal surface of a separated semiconductor chip is not clearly disclosed.

Patent Document 2 intends to improve the reliability of a nitride-based semiconductor light-emitting element. In Patent Document 2, there is no description of the polarization degree, and the relationship between the cleaving direction and the polarization degree is indefinite. Also, in Patent Document 2, the angle which is formed between a lateral surface and the principal surface of a separated semiconductor chip is not clearly disclosed.

Patent Document 3 intends to improve light extraction from a nitride-based semiconductor light-emitting element. Therefore, in Patent Document 3, there is no description of the polarization degree, and the relationship between the cleaving direction and the polarization degree is indefinite. Also, in Patent Document 3, the angle which is formed between a lateral surface and the principal surface of a separated semiconductor chip is not clearly disclosed.

The present inventors conducted detailed research on the dependence of a polarization degree of polarized light emitted from a nitride-based semiconductor light-emitting element which is achieved in the case where the polarized light is transmitted through a lateral surface of the nitride-based semiconductor light-emitting element to the outside on the shape of the nitride-based semiconductor light-emitting element, and the dependence of a polarization degree of polarized light emitted from a nitride-based semiconductor light-emitting element which is achieved in the case where the polarized light is reflected at a lateral surface of the nitride-based semiconductor light-emitting element before being transmitted to the outside on the shape of the nitride-based semiconductor light-emitting element. Part of the polarized light is reflected at the interface between the lateral surface of the nitride-based semiconductor light-emitting element and the outside, while the remaining part is transmitted through the interface. As a result of the research conducted by the present inventors, it was discovered that these transmittance and reflectance depend on the polarization direction of the polarized light generated in the active layer of the nitride-based semiconductor light-emitting element and the shape of the lateral surface of the nitride-based semiconductor light-emitting element. Based on this discovery, the shape of the nitride-based semiconductor light-emitting element which enables reduction of the polarization degree of light radiated from the nitride-based semiconductor light-emitting element was conceived.

Hereinafter, embodiments of the present invention will be described with reference to the drawings. In the drawings mentioned below, for the sake of simple description, elements which perform substantially the same functions are denoted by the same reference numerals. Note that the present invention is not limited to the embodiments which will be described below.

Embodiment 1

The first embodiment is described with reference to FIG. 6.

Figure 6:
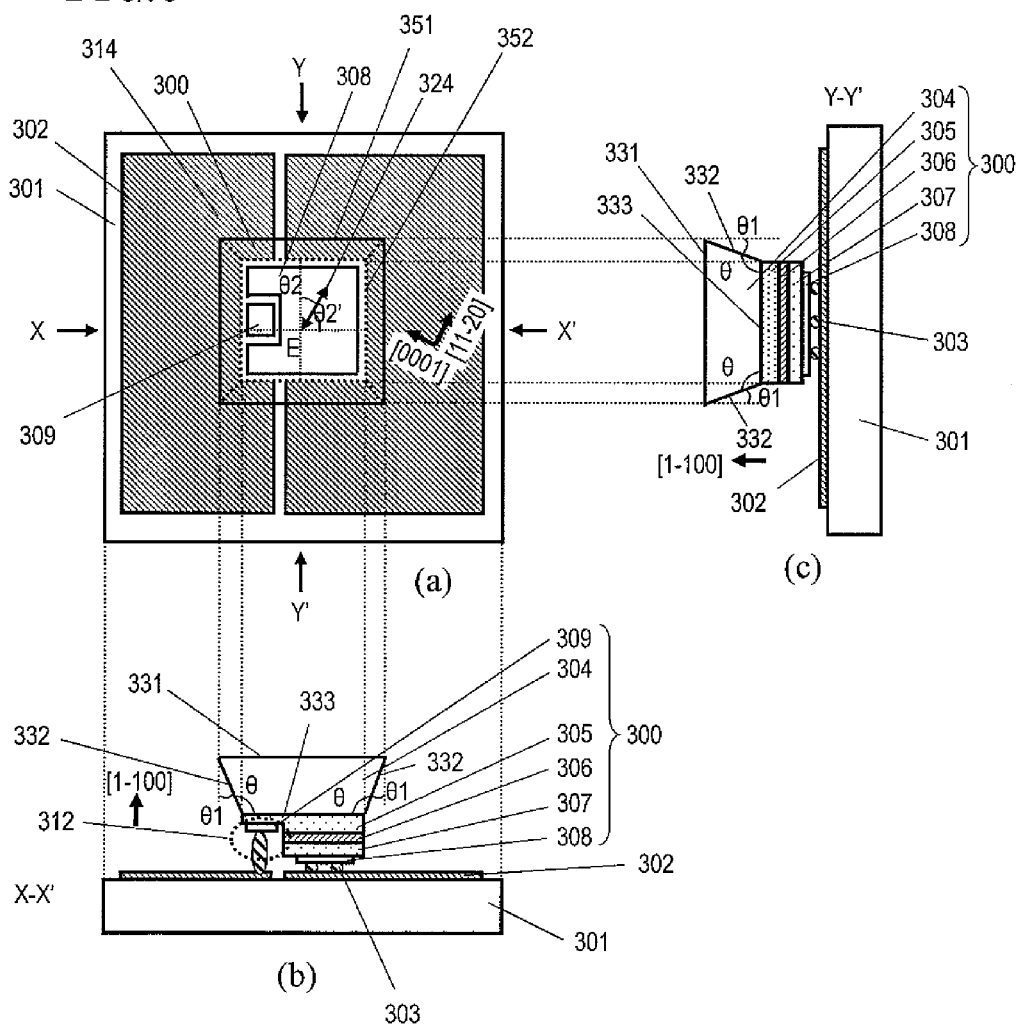
FIGS. 6(a) to 6(c) are diagrams showing a nitride-based semiconductor light-emitting element of Embodiment 1.

Firstly, refer to FIGS. 6(*a*) to 6(*c*). FIG. 6(*a*) is a top view schematically showing a nitride-based semiconductor light-emitting device of the present embodiment. FIG. 6(*b*) is a cross-sectional view taken along line X-X' of FIG. 6(*a*). FIG. 6(*c*) is a cross-sectional view taken along line Y-Y' of FIG. 6(*a*).

A nitride-based semiconductor light-emitting element 300 of the present embodiment includes a substrate 304 which has a principal surface 333, a rear surface that is a light extraction surface 331, and a plurality of lateral surfaces 332, and a nitride semiconductor multilayer structure which is provided on the principal surface 333 of the substrate 304 and which includes a nitride semiconductor active layer 306 that emits polarized light.

Here, an angle which is formed by the plurality of lateral surfaces 332 of the substrate 304 with respect to the principal surface 333 of the substrate 304 is referred to as angle θ. In commonly-employed elements, the lateral surfaces of a substrate are perpendicular to the principal surface and the rear surface of the substrate, and the angle θ is 90°. In the present embodiment, the lateral surfaces 332 of the substrate 304 are inclined with respect to the vertical direction of the principal surface 333 and the light extraction surface 331 of the substrate 304. The lateral surfaces 332 are inclined such that the lateral surfaces 332 extend outward in a direction from the principal surface 333 to the light extraction surface 331 of the substrate 304. Therefore, the angle θ is greater than 90°.

In the present embodiment, the sides that constitute the perimeter of the principal surface 333 of the substrate 304 are inclined with respect to the a-axis direction (polarization direction 324). The sides that constitute the perimeter of the principal surface 333 of the substrate 304 can be rephrased as "the intersecting lines of the plurality of lateral surfaces 332 of the substrate 304 and the principal surface 333 of the substrate 304". Where the absolute value of an angle which is formed by the intersecting lines with respect to the polarization direction 324 in the principal surface 333 of polarized light (a-axis direction) is referred to as angle θ2, the angle θ2 (mod) 180° is an angle which does not include 0° or 90°. Here, "mod 180°" refers to an angle of the reminder resulting from division of that angle by 180°.

According to the present embodiment, the lateral surfaces 332 of the substrate 304 are inclined with respect to the vertical direction of the principal surface 333 and the light extraction surface (rear surface) 331 of the substrate 304, and therefore, the proportion of reflection at the lateral surfaces 332 of the light emitted from the nitride semiconductor active layer 306 can be increased. Due to the Goos-Hanchen shift, a phase difference occurs in the light reflected at the lateral surfaces 332, and the light reflected at the lateral surfaces 332 is converted to elliptical polarization. This phase difference occurs depending on the refractive index of the substrate, n1, and the refractive index of a portion surrounding the substrate, n2. The light reflected at the lateral surfaces 332 outgoes from the principal surface 333 to the outside, for example. According to the present embodiment, light from the nitride semiconductor active layer 306 can be converted to elliptical polarization, and therefore, the polarization degree is reduced, and the quality of emission can be improved. Details of the effects will be described later using calculation results.

The specific structure of the nitride-based semiconductor light-emitting element 300 of the present embodiment is not particularly limited, so long as it includes an element which has a polarization characteristic. The nitride-based semiconductor light-emitting element 300 includes, for example, a substrate 304 which includes at least an m-plane GaN layer, a n-type nitride semiconductor layer 305 which is formed on the m-plane GaN layer, a nitride semiconductor active layer 306, a p-type nitride semiconductor layer 307, a p-side electrode 308 which is provided so as to be in contact with the p-type nitride semiconductor layer 307, and a n-side electrode 309 which is provided so as to be in contact with the n-type nitride semiconductor layer 305. Here, the nitride semiconductor may be an $Al_xIn_yGa_zN$ (x+y+z=1, x≥0, y≥0, z≥0) semiconductor or may be a GaN-based semiconductor ($Al_xIn_yGa_zN$ (x+y+z=1, x≥0, y≥0, z>0).

In this specification, the non-polar plane, "a-plane", "r-plane", "−r plane", "(11-22) plane", and "m-plane" include not only planes which are perfectly parallel to the non-polar plane, a-plane, r-plane, −r plane, "(11-22) plane", and m-plane but also planes which are inclined (off-cut) by an angle of ±5° or less with respect to the non-polar plane, a-plane, r-plane, −r plane, "(11-22) plane", and m-plane. That is, the substrate 304 may be an off-cut substrate (off substrate) which is inclined by an angle of 5° or less. With just a slight incline with respect to the m-plane, the effect of a variation of the spontaneous electrical polarization is very small. On the other hand, according to the crystal growth technology, epitaxial growth of a semiconductor layer is easier on a substrate in which the crystal orientation is slightly inclined rather than on a substrate in which the crystal orientation is strictly identical. Thus, in some cases, it may be beneficial to incline the crystal plane for the purpose of improving the quality of a semiconductor layer which is to be epitaxially grown or increasing the crystal growth rate, while sufficiently decreasing the effect of the spontaneous electrical polarization.

If the inclination angle is large, the polarization direction varies depending on whether it is off in the a-axis direction or off in the c-axis direction. However, if it is off by about ±5°, a direction in which the electric field intensity is the strongest is identical with the a-axis direction. In this case, the "polarization direction in the principal surface" refers to a direction resulting from projection of the a-axis direction onto the principal surface.

The substrate 304 may be an m-plane GaN substrate or may be an m-plane SiC substrate which includes an m-plane GaN layer in its surface or a r-plane or m-plane sapphire substrate which includes an m-plane GaN layer in its surface. The most important aspect is that light emitted from the active layer is polarized in a specific direction.

In the case where the substrate 304 is an m-plane GaN substrate, in consideration of the above-described inclination, σ1 (mod 180°) is not less than 85° and not more than 95° (where σ1 is the absolute value of an angle which is formed between the polarization direction of polarized light and the normal line of the principal surface of the substrate 304), and σ2 (mod 180°) is not less than 85° and not more than 95° (where σ2 is the absolute value of an angle which is formed between the polarization direction of polarized light and the normal line of the rear surface of the substrate 304).

The plane orientation of the nitride semiconductor active layer is not limited to the m-plane but only needs to be a non-polar plane or a semi-polar plane. An example of the non-polar plane is a-plane. Examples of the semi-polar plane include −r plane and (11-22) plane. As previously described, a nitride semiconductor active layer formed on the m-plane mainly emits light whose electric field intensity is deviated in a direction parallel to the a-axis. A nitride semiconductor active layer formed on the a-plane mainly emits light whose electric field intensity is deviated in a direction parallel to the m-axis. A nitride semiconductor active layer formed on the (11-22) plane, which is a semi-polar plane, mainly emits light whose electric field intensity is deviated in a direction parallel to the m-axis when the mole fraction of In in the nitride semiconductor active layer is small. However, the nitride semiconductor active layer formed on the (11-22) plane mainly emits light whose electric field intensity is deviated in a direction parallel to the [−1-123] direction, when the mole fraction of In in the nitride semiconductor active layer is large. The polarization characteristic of the nitride semiconductor active layer 306 provided on such a semi-polar plane depends on the behaviors of the upper two of the valence bands (A band and B band) and varies according to the amount of strain imposed on the nitride semiconductor active layer 306 or the quantum confinement effect in some cases.

For example, in the case where a substrate which is off-cut by 5° with respect to the m-plane is used, the nitride semiconductor active layer 306 also has a plane orientation which is inclined by 5° with respect to the m-plane. When the off-cut angle with respect to the m-plane is small as described herein, the nitride semiconductor active layer 306 mainly emits light whose electric field intensity is deviated in a direction parallel to the a-axis.

In the present embodiment, the principal surface of the substrate refers to a substrate surface on which the semiconductor multilayer structure is to be formed. The principal surface of each nitride semiconductor layer refers to a surface of the growing direction of each nitride semiconductor layer (growing surface). These principal surfaces are generally parallel to one another. Hereinafter, a surface which is simply referred to as "principal surface" without a reference mark means "the principal surface of the substrate or the nitride semiconductor active layer".

An undoped GaN layer may be provided between the nitride semiconductor active layer 306 and the p-type nitride semiconductor layer 307.

The n-type nitride semiconductor layer 305 is made of, for example, n-type $Al_uGa_vIn_wN$ (u+v+w=1, u≥0, v≥0, w≥0).

The n-type dopant used may be, for example, silicon (Si). The p-type nitride semiconductor layer 307 is made of, for example, a p-type Al$_s$Ga$_t$N (s+t=1, s≥0, t≥0) semiconductor. As the p-type dopant, for example, Mg is added. Examples of the p-type dopant other than Mg include Zn and Be. In the p-type nitride semiconductor layer 307, the mole fraction of Al, s, may be uniform along the thickness direction. Alternatively, the Al mole fraction s may vary either continuously or stepwise along the thickness direction. Specifically, the thickness of the p-type nitride semiconductor layer 307 is, for example, about not less than 0.05 μm and not more than 2 μm.

Part of the p-type nitride semiconductor layer 307 near the upper surface, i.e., near the interface with the p-side electrode 308, may be made of a semiconductor whose Al mole fraction s is zero, i.e., GaN. Also, in this case, the GaN contains a p-type impurity with high concentration and is capable of functioning as a contact layer.

The nitride semiconductor active layer 306 has a GaInN/GaInN multi-quantum well (MQW) structure in which, for example, Ga$_{1-x}$In$_x$N well layers, each having a thickness of about not less than 3 nm and not more than 20 nm, and Ga$_{1-y}$In$_y$N well layers (0≤y<x<1) barrier layers, each having a thickness of about not less than 5 nm and not more than 30 nm, are alternately stacked one upon the other.

The wavelength of light emitted from the nitride-based semiconductor light-emitting element 300 depends on the mole fraction of In, x, in the Ga$_{1-x}$In$_x$N semiconductor that is the semiconductor composition of the above-described well layers. A piezoelectric field would not be generated in the nitride semiconductor active layer 306 formed on the m-plane. Therefore, decrease of the luminous efficacy can be prevented even when the In mole fraction is increased.

The n-side electrode 309 has, for example, a multilayer structure of a Ti layer and a Pt layer (Ti/Pt). The p-side electrode 308 may generally cover the entire surface of the p-type nitride semiconductor layer 307. The p-side electrode 308 has, for example, a multilayer structure of a Pd layer and a Pt layer (Pd/Pt).

The nitride-based semiconductor light-emitting element 300 is electrically connected to a wire 302 which is provided on a mounting base 301 via a bump 303.

The substrate 304 of the nitride-based semiconductor light-emitting element 300 is enclosed by the principal surface 333, the light extraction surface (rear surface) 331 that is generally parallel to the principal surface 333, and the four lateral surfaces 332. Light emitted by the nitride semiconductor active layer 306 mainly outgoes from the light extraction surface 331. On the principal surface 333, the semiconductor multilayer structure is provided. The principal surface 333, the light extraction surface 331, and the principal surface of the nitride semiconductor active layer 306 are generally parallel to one another.

In the present embodiment, a portion of light that is incident on the four lateral surfaces 332 may not be reflected at the respective lateral surfaces 332 but transmitted through the respective lateral surfaces 332. As described herein, the four lateral surfaces 332 may be light extraction surfaces. The four lateral surfaces 332 are inclined with an angle greater than 90° with respect to the principal surface 333. As a result, the area of the light extraction surface 331 is larger than the area of the principal surface 333 of the substrate 304. An angle resulting from subtraction of 90° from this inclination is referred to as angle θ1. That is, an angle which is formed by the four lateral surfaces 332 with respect to the normal direction of the principal surface 333 is referred to as angle θ1.

The contour 351 of the light extraction surface 331 and the contour 352 of the principal surface 333 have square shapes in the top view. In the top view, the contour 351 and the contour 352 may be concentric, and the sides of the contour 351 and the sides of the contour 352 may be parallel to each other. With such an arrangement, all of the four angles θ1 that are formed between the normal direction of the principal surface and the four lateral surfaces 332 are equal angles.

According to the present embodiment, the contour 352 is square, and therefore, the angle formed between the long axis direction of light which is converted to elliptical polarization at one of the lateral surfaces and the long axis direction of light which is converted to elliptical polarization at another lateral surface which is adjacent to the former lateral surface is a right angle. Thus, the polarization degree can be efficiently reduced. Further, the four lateral surfaces have generally equal areas, and therefore, the light distribution characteristics can be easily controlled.

The contours 351 and 352 may have similar shapes or may have different shapes. The contours 351 and 352 may have other quadrangular shapes or may have other polygonal shapes. The contours 351 and 352 may have a shape which includes a curve. The number of the lateral surfaces 332 may be three or may be five or more.

Figure 32:
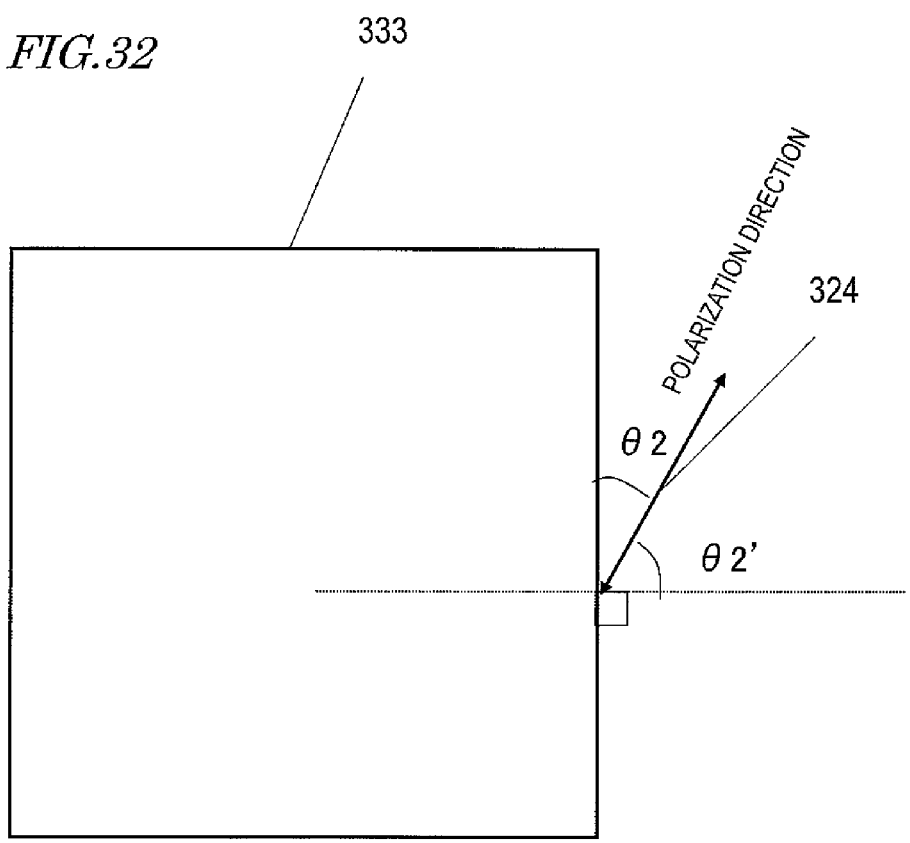
FIG. 32 is a diagram for illustrating θ2.

It is desirable that θ1 is set to an angle which is equal to or greater than the critical angle θc that is determined by the refractive index of the substrate 304 and the refractive index of a portion surrounding the substrate 304. Here, the refractive index of a portion surrounding the substrate 304 refers to the refractive index of a portion outside the lateral surfaces of the substrate. The portion outside the lateral surfaces of the substrate may be a resin, glass, air or vacuum. Specifically, θc=sin$^{-1}$(n2/n1) holds true where n1 is the refractive index of the substrate 304 and n2 is the refractive index of a portion surrounding the substrate 304. Making θ1 equal to or greater than the critical angle θc enables total reflection of light which is generated in the nitride semiconductor active layer 306 and which is then incident on the lateral surfaces 332. Accordingly, the polarization degree can be further reduced. θ1 may be equal to or greater than the critical angle Go and fall in the angle range of not less than 30° and less than 90°. When θ1 is in this angle range, light which is reflected at the lateral surfaces 332 is extracted without undergoing total reflection at the light extraction surface 331.

Where the absolute value of an angle formed between one of the sides of the contour 352 which is selected as an angular reference and the polarization direction 324 in the principal surface 333 of polarized light of the nitride-based semiconductor light-emitting element 300 is θ2, θ2 (mod 180°) is an angle which does not include 0° or 90° (see FIG. 32). Where the absolute value of an angle formed between a side which is adjacent to the side that is selected as an angular reference and the polarization direction 324 in the principal surface 333 of polarized light of the nitride-based semiconductor light-emitting element 300 is θ2', θ2'=|90°−θ2| holds true because the contour 352 has a square shape.

Figure 7A:
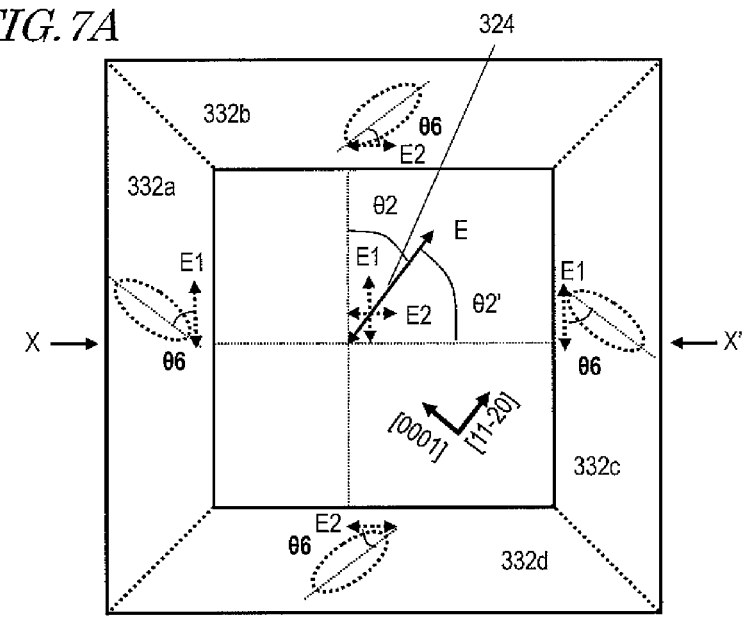
FIGS. 7A to 7C are diagrams for illustrating the principle of reducing the polarization degree in Embodiment 1.
Figure 7B:
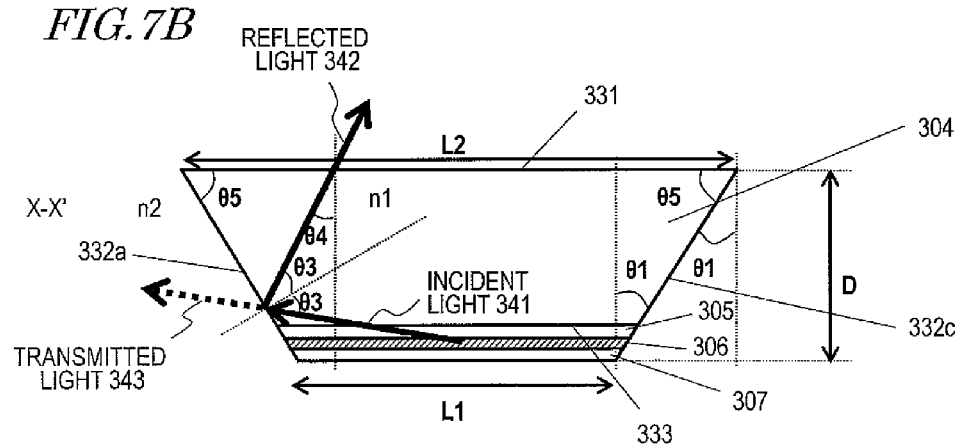
Figure 7C:
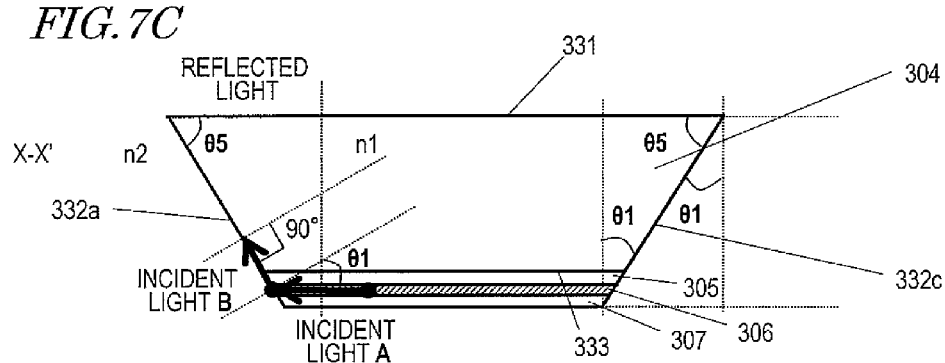

Next, the principle of reducing the polarization in the configuration of the present embodiment is described with reference to FIGS. 7A to 7C. In FIGS. 7A to 7C, for the sake of simple illustration, the n-side electrode 309, the p-side electrode 308, the mounting base 301, the wire 302, and the bump 303 are omitted.

First, the shape of the nitride-based semiconductor light-emitting element 300 is defined. For the sake of simplicity, it is assumed that the contour of the light extraction surface 331 and the contour of the principal surface 333 are square. The refractive index of the substrate 304 is n1, and the refractive index of the surrounding portion is n2. The length of one side of the principal surface of the semiconductor multilayer structure is L1, the length of one side of the light extraction surface 331 is L2, and the distance between the light extraction surface 331 and the principal surface of the semiconductor multilayer structure is D. The four angles θ1 that are formed between the normal direction of the principal surface of the semiconductor multilayer structure and the four lateral surfaces 332 are all equal. Here, the above assumptions lead to that the four light extraction surfaces are surfaces which have exactly equal shapes and exactly equal areas, although these surfaces are referred to as "lateral surface 332a", "lateral surface 332b", "lateral surface 332c", and "lateral surface 332d" such that they are distinguishable from one another. The lateral surface 332a and the lateral surface 332c face each other, and the lateral surface 332b and the lateral surface 332d face each other.

Next, the angles are defined. In FIG. 7A, the angle θ2 represents an angle formed by the polarization direction 324 in the principal surface of polarized light of the light emitted by the nitride semiconductor active layer 306 with respect to sides of the contour of the principal surface 333 which are in contact with the lateral surface 332a and the lateral surface 332c. The angle θ2' represents an angle formed by the polarization direction 324 in the principal surface of polarized light of the light emitted by the nitride semiconductor active layer 306 with respect to sides of the contour of the principal surface 333 which are in contact with the lateral surface 332b and the lateral surface 332d. Since the contour of the principal surface 333 is square, θ2'=90−θ2 holds true. These angles θ2 and θ2' are greater than 0° and smaller than 90° (angles which do not include 0° or 90°).

In FIG. 7B, which shows the cross section taken along line X-X' of FIG. 7A, the angle which is formed between the normal direction of the principal surface and the lateral surfaces 332 is referred to as θ1. Where the angle which is formed between the light extraction surface 331 and lateral surfaces 332 is θ5, θ5=90−θ1 holds true. The length of one side of the light extraction surface 331 is determined by D, L1, and θ5. Now, in view of a case where light produced in the nitride semiconductor active layer 306 is incident on the lateral surfaces 332, this light is referred to as "incident light 341". Light which is reflected at the lateral surfaces 332 is referred to as "reflected light 342". Light which is transmitted through the lateral surfaces 332 is referred to as "transmitted light 343". The angle which is formed between the incident light 341 and the normal direction of the lateral surfaces 332 is referred to as θ3. The angle which is formed by the reflected light with respect to the normal direction of the light extraction surface 331 is referred to as θ4.

Hereinafter, a case where only one of the lateral surfaces 332 is considered, a case where the four lateral surfaces 332 are considered, and a case where all of the light extraction surfaces are considered are described in this order.

(Case where Only One of the Lateral Surfaces 332 is Considered)

Firstly, the polarization degree of light reflected by one of the lateral surfaces 332 is discussed.

The present embodiment utilizes a phenomenon that, when the incident light 341 is reflected by the lateral surface 332, a phase difference occurs due to the Goos-Hanchen shift. When incident light includes a p-polarization component and an s-polarization component, Formula 1 and Formula 2 shown below are given:

$$\tan\left(\frac{\delta_p}{2}\right) = \frac{-\sqrt{\sin^2\theta_3 - (n_2/n_1)^2}}{(n_2/n_1)^2 \cos\theta_3} \quad \text{(Formula 1)}$$

$$\tan\left(\frac{\delta_s}{2}\right) = \frac{-\sqrt{\sin^2\theta_3 - (n_2/n_1)^2}}{\cos\theta_3} \quad \text{(Formula 2)}$$

where $\delta p$ is a shift of the phase which occurs at the time of reflection of the p-polarization and $\delta s$ is a shift of the phase which occurs at the time of reflection of the s-polarization.

Further, Formula 3 shown below is given:

$$\tan\left(\frac{\delta}{2}\right) = \frac{\cos\theta_3 \sqrt{\sin^2\theta_3 - (n_2/n_1)^2}}{\cos^2\theta_3} \quad \text{(Formula 3)}$$

where $\delta$ is the relative phase difference.

When the light is reflected, a phase difference occurs between the s-polarized light and the p-polarized light according to the ratio of the refractive indices at the interface. Thus, when it is configured such that the incident light 341 on the lateral surface 332 includes the p-polarization component and the s-polarization component, incident linearly-polarized light can be converted to elliptical polarization (or circular polarization), so that the polarization degree can be reduced.

In the case where the polarized light is assumed as linear polarization, the electric field component E of the light can be separated into a component E1 that is parallel to sides which are in contact with the lateral surface 332a and the lateral surface 332c and a component E2 that is parallel to sides which are in contact with the lateral surface 332b and the lateral surface 332d. Here, E1 and E2 are light which have equal phases. In this case, E1 is the S-polarization component for the lateral surface 332a and the lateral surface 332c. On the other hand, E2 is the S-polarization component for the lateral surface 332b and the lateral surface 332d. The phase of the S-polarization reflected light is in advance of that of the p-polarization reflected light.

Figure 8A:
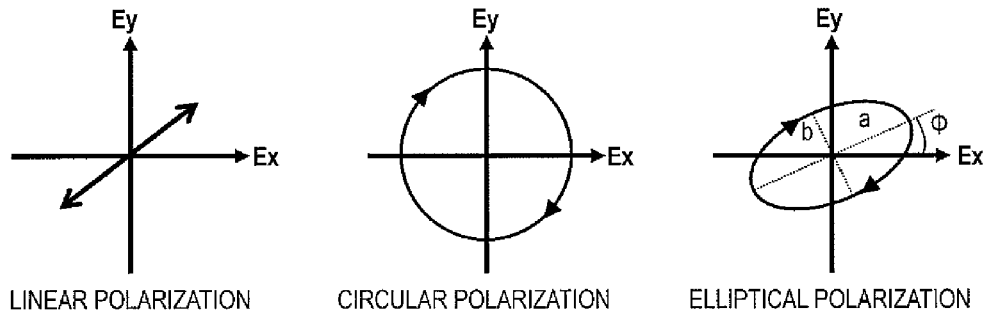
FIG. 8A is a diagram showing the types of polarization.

FIG. 8A shows the definition of the state of linear polarization the state of circular polarization, and the state of elliptical polarization. The trajectory of elliptically-polarized light is expressed as $$\left(\frac{E_x}{A_{x0}}\right)^2 + \left(\frac{E_y}{A_{y0}}\right)^2 - 2\left(\frac{E_x}{A_{x0}}\right)\left(\frac{E_y}{A_{y0}}\right)\cos\delta = \sin^2\delta \quad \text{(Formula 4)}$$

or the following general expression, Formula 5:

$$\left(\frac{E_\xi}{a}\right)^2 + \left(\frac{E_\eta}{b}\right)^2 = 1 \quad \text{(Formula 5)}$$

Formula 4 is the definition for a case where a system of arbitrary x and y coordinates which are orthogonal to each other is used. $A_{x0}$ is the electric field amplitude in the x direction, $A_{y0}$ is the electric field amplitude in the y direction, $E_x$ is the electric field in the x direction, $E_y$ is the electric field in the y direction, and $\delta$ is the phase difference between the electric field amplitude in the x direction and the electric field amplitude in the y direction. Formula 5 is the definition for a case where the short axis direction and the long axis direction of an ellipse are set to the coordinate axes. When b>a holds true, $E\xi$ is the electric field in the short axis direction of the ellipse, $E\eta$ is the electric field in the long axis direction of the ellipse, a is the electric field amplitude in the short axis direction, and b is the electric field amplitude in the long axis direction. In that case, the oblateness of the ellipse is defined by polarization ellipticity $\chi$ as follows:

$$\tan\chi = \frac{b}{a} \quad \text{(Formula 6)}$$

The angle which is formed by the long axis direction of the ellipse with respect to the x direction is defined by the principal axis azimuth angle $\phi$ and expressed as follows:

$$\tan(2\phi)=\tan(2\alpha)\cdot\cos\delta \quad \text{(Formula 7)}$$

Here, $\alpha$ meets the following equation:

$$\tan\alpha = A_{y0}/A_{x0} \quad \text{(Formula 8)}$$

As seen from the above, the relative phase difference occurs between the s-polarized light and the p-polarized light according to the ratio of the refractive indices at the interface, and the linearly-polarized light is converted to the elliptical polarization.

Light emitted from the nitride semiconductor active layer 306 emits in various directions. Here, the angle range in which θ3 can fall is discussed with reference to FIG. 7C, which shows a cross-sectional view taken along line X-X' of FIG. 7A. θ3 is the smallest in the case of incident light A of FIG. 7C, where light emitted from the nitride semiconductor active layer 306 travels in the plane direction of the nitride semiconductor active layer 306. In this case, θ3 is equal to θ1. θ3 is the largest in the case of incident light B of FIG. 7C, where light emitted from an end portion of the nitride semiconductor active layer 306 travels along the lateral surface 332. In this case, θ3 is 90°. Therefore, θ3 falls in the range of not less than θ1 and not more than 90°.

For utilizing reflection at the lateral surface 332, a large portion of the light may be reflected at the lateral surface 332. Since θ3 falls in the range of not less than θ1 and not more than 90°, substantially all of the incident light 341 is totally reflected at the lateral surface 332, so long as θ1 is equal to or greater than the critical angle θc. If θ4<θc holds true, light reflected at the lateral surface 332 can be extracted at the light extraction surface 331. In view of the relationships of θ4=θ5−θ3 and θ5=90−θ1, θ4=90−θ1−θ3<θc holds true. In view of the aforementioned conditions, θ3 may fall in the range of not less than θ1 and not more than 90°. When θ3=θ1 holds true, θ4 is the largest, and 90−2·θ1<θc holds true. The angle range of θc which satisfies this formula and the relationship of θ1>θc at the same time is not less than 30° and not more than 90°.

Figure 9A:
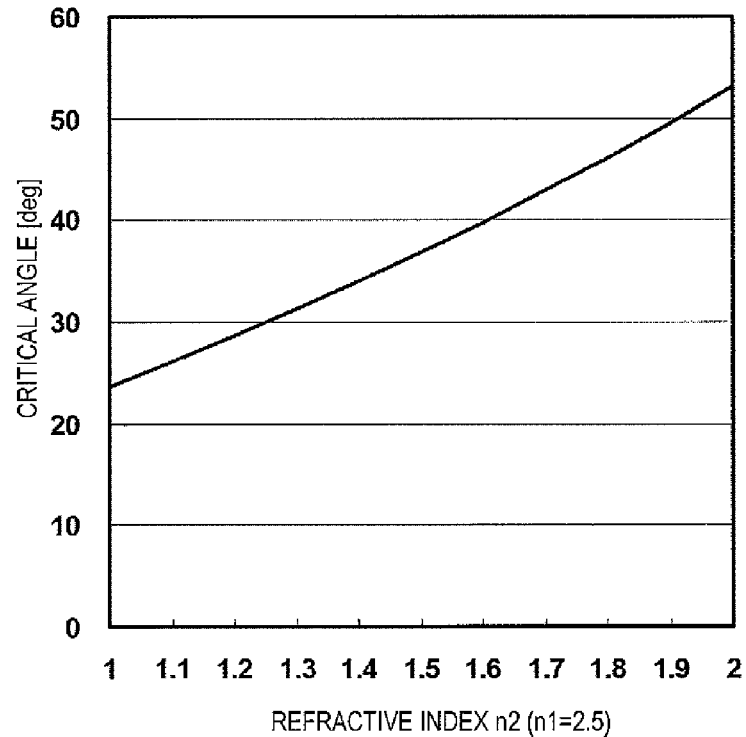
FIGS. 9A and 9B are graphs showing calculation results of the critical angle and the relative phase difference in the case where one lateral surface 332 in Embodiment 1 is considered.

FIG. 9A is a graph showing the relationship of the critical angle with respect to the refractive index n2 where the refractive index of a gallium nitride, 2.5, is employed as the refractive index n1. As the refractive index n2, i.e., the refractive index of a portion surrounding the nitride-based semiconductor light-emitting element 300, increases, the critical angle also increases. This means that light is more readily extracted from the nitride-based semiconductor light-emitting element 300 to the outside. As seen from FIG. 9A, when the refractive index n1 is 2.5, a value of the refractive index n2 which satisfies the condition that the critical angle θc is not less than 30° is not less than 1.25. That is, the critical angle θc is not less than 30° when the value of n2 is not less than a half of the value of n1.

Figure 9B:
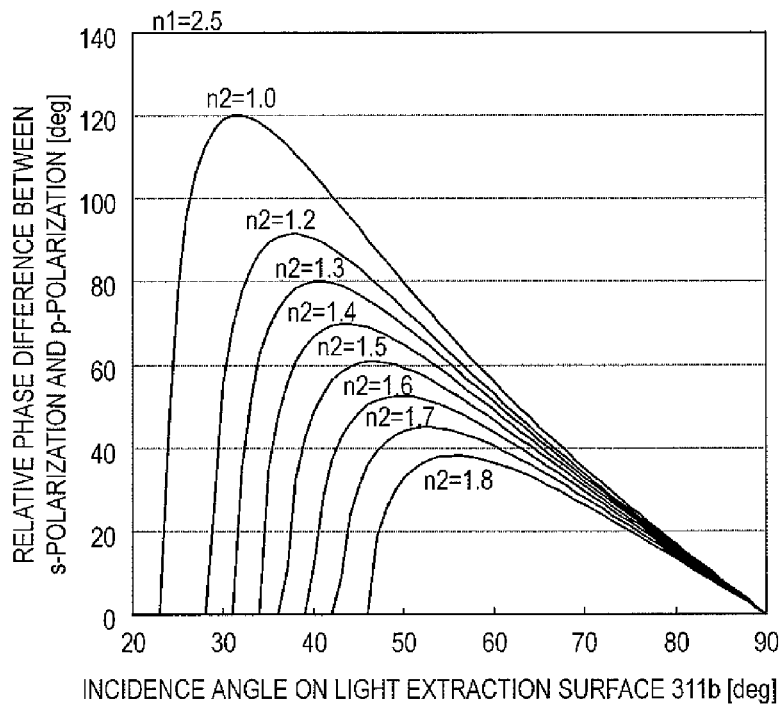

FIG. 9B shows incidence angles θ3 on the lateral surface 332 on the horizontal axis and calculated values of the relative phase difference δ between the s-polarization and the p-polarization of the reflected light 342 on the vertical axis. The refractive index n1 is 2.5, and the refractive index n2 is varied from 1.0 to 1.8.

Only under the condition that the relative phase difference δ is 90°, the reflected light 342 on the lateral surface 332 is converted to circular polarization. Perfect circular polarization is realized when n2 is in the range from 1.0 to 1.2. Actually, the angle range of θ3 can be not less than θc and not more than 90°, and therefore, the reflected light 342 is converted to elliptical polarization.

Figure 8B:
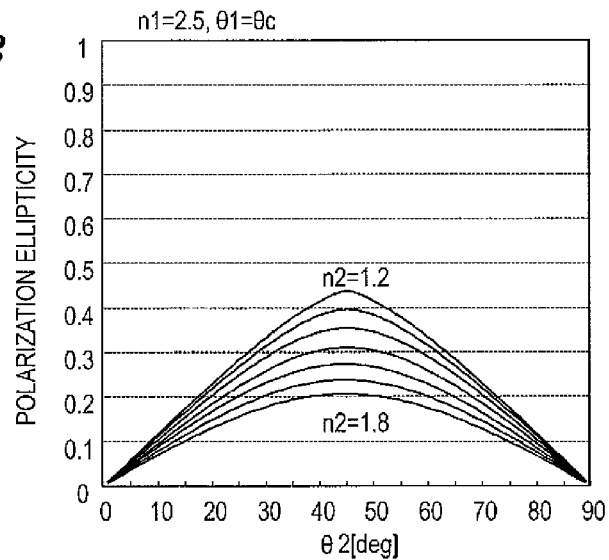
FIGS. 8B and 8C are graphs showing calculation results of the polarization ellipticity and the polarization degree in the case where one lateral surface 332 in Embodiment 1 is considered.

FIG. 8B shows calculation results of the relationship between the polarization ellipticity $\chi$ of the reflected light 342 and θ2 in the case where θ1 is equal to the critical angle θc. Here, θ2 refers to the angle θ2 that is formed between the polarization direction 324 in the principal surface of polarized light of the nitride-based semiconductor light-emitting element 300 and the contour of the light extraction surface 331 and the respective sides of the principal surface 333. n2 is varied from 1.2 to 1.8 with intervals of 0.1. The polarization ellipticity $\chi$ is the maximum when θ2 is 45°, resulting in an upwardly convex curve. As the refractive index n2 decreases, the polarization ellipticity $\chi$ increases.

Figure 8C:
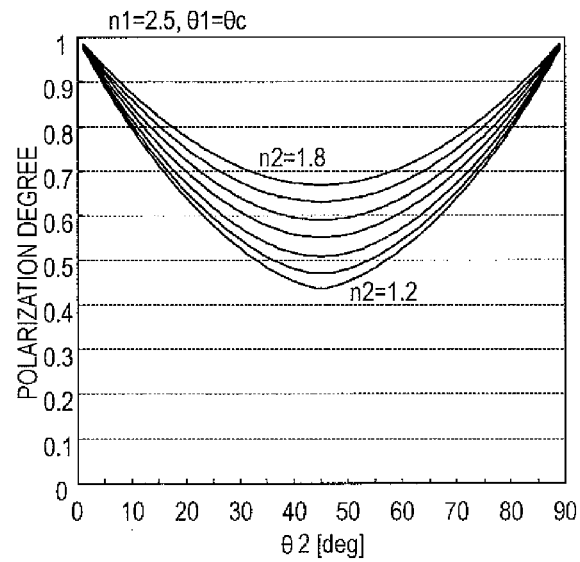

FIG. 8(c) shows calculation results of the relationship between the polarization degree of the reflected light 342 and θ2 in the case where θ1 is equal to the critical angle θc. n2 is varied from 1.2 to 1.8 with intervals of 0.1. The polarization degree is the minimum when θ2 is 45°, resulting in a downwardly convex curve. The refractive index n2 decreases as the polarization degree decreases. As seen from FIG. 8(c), θ2 may be from 35° to 55°. θ2 may be in the range from 40° to 50°. When θ2 is in this range, the polarization degree can be further decreased.

It is proved from the above calculation results that the polarization degree can be reduced by converting the reflected light 342 to elliptical polarization by using a phase difference which occurs due to the Goos-Hanchen shift.

When θ1 is equal to or greater than the critical angle θc as described above, almost all of light which is incident on the lateral surface 332 can be reflected. Note that, however, θ1 may be smaller than the critical angle θc and may be in a range which will be described below.

Figure 10A:
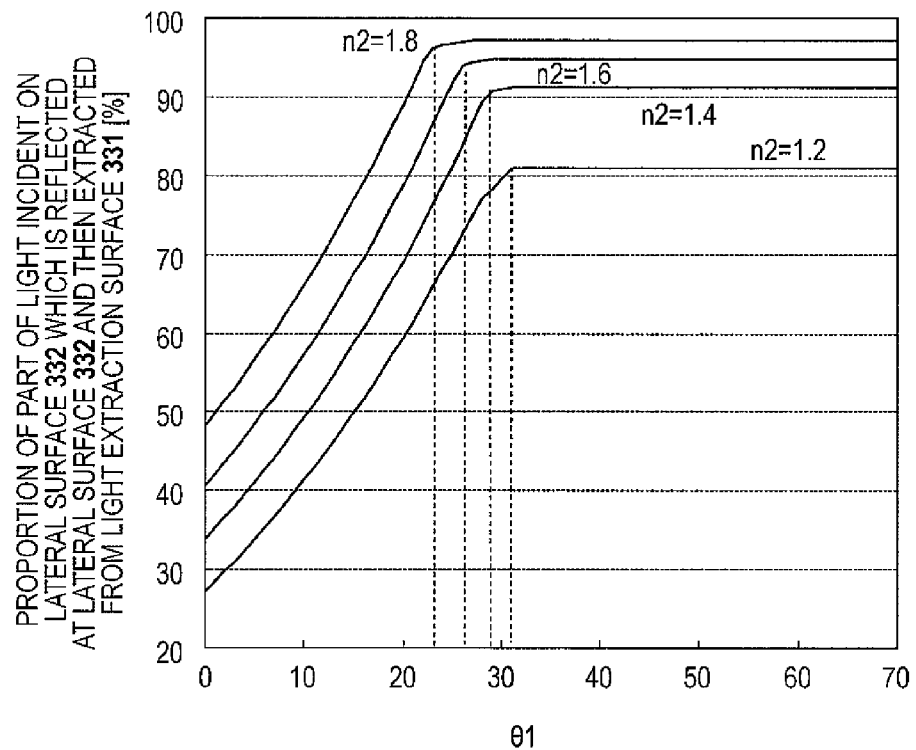
FIG. 10A is a graph showing the proportion (calculation result) of part of the light incident on the lateral surface 332 which is reflected at the lateral surface 332 and outgoing from a light extraction surface 331.

FIG. 10A is a graph showing the proportion (simulation result) of part of the light incident on the lateral surface 332 which is reflected at the lateral surface 332 and outgoing from a light extraction surface 331. In FIG. 10A, the horizontal axis represents the angle θ1, and the vertical axis represents the proportion of part of the light incident on the lateral surface 332 which is reflected at the lateral surface 332 and outgoing from a light extraction surface 331. The results shown in FIG. 10A were obtained on the assumption that the refractive index of GaN was 2.5, and four cases of the refractive index n2 were 1.2, 1.4, 1.6, and 1.8.

Figure 10B:
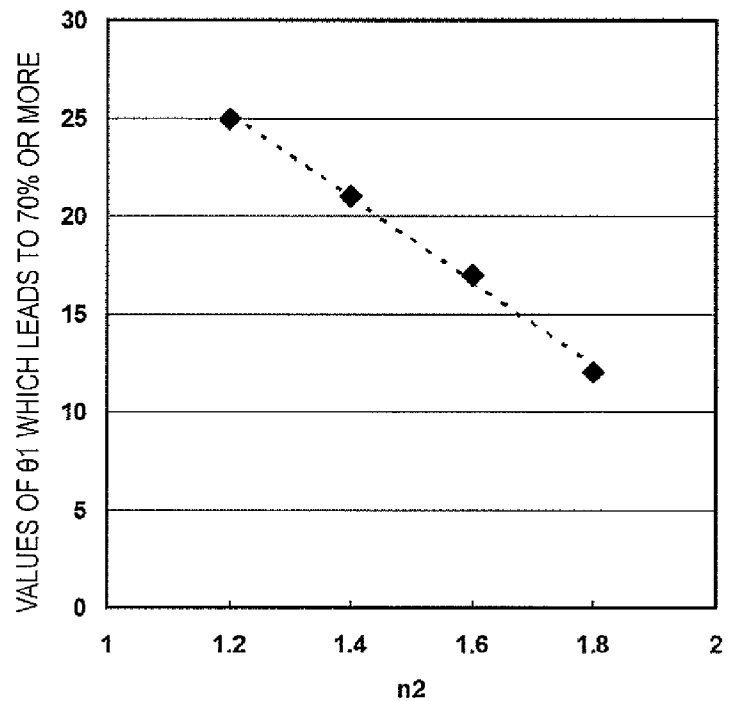
FIG. 10B is a graph where values are plotted at which the proportion of part of the light incident on the lateral surface 332 which is reflected at the lateral surface 332 and outgoing from the light extraction surface 331 is 70% in the graph of FIG. 10A.

FIG. 10B is a graph where values are plotted at which the proportion of part of the light incident on the lateral surface 332 which is reflected at the lateral surface 332 and outgoing from a light extraction surface 331 is 70% in the graph of FIG. 10A. In the graph of FIG. 10B, the horizontal axis represents the refractive index n2, and the vertical axis represents the values of the angle θ1 at which the above-described proportion is 70%. As seen from FIG. 10B, as the value of the refractive index n2 increases, the value of the vertical axis decreases with a constant slope. The profile of FIG. 10B is expressed as Formula 9 shown below:

$$\theta1=51.0-21.5\times n2 \quad \text{(Formula 9)}$$

As seen from the above results, when θ1 is greater than the value of Formula 9, the proportion of part of the light incident on the lateral surface 332 which is reflected at the lateral surface 332 and outgoing from a light extraction surface 331 can be not less than 70%.

(Case where Four Lateral Surfaces 332a, 332b, 332c, and 332d are Considered)

Next, the polarization degree for a case where all of the light reflected at the four lateral surfaces 332a, 332b, 332c, and 332d are considered is discussed. Here, the discussion is provided with again reference to FIG. 7A. In the discussion, the electric field component E of polarized light is separated into E1 and E2. In this case, E1 is the S-polarization component for the lateral surface 332a and the lateral surface 332c. On the other hand, E2 is the S-polarization component for the lateral surface 332b and the lateral surface 332d. Here, assuming that the principal axis azimuth angle of light which is converted to elliptical polarization at the lateral surfaces 332 is θ6, the principal axis of the ellipse is inclined with respect to E1 for the lateral surface 332a and the lateral surface 332c, and the principal axis of the ellipse is inclined with respect to E2 for the lateral surface 332b and the lateral surface 332d. Here, E1 and E2 are inclined by 90°, and therefore, the principal axis of light which is converted to elliptical polarization at the lateral surface 332a and the lateral surface 332c and the principal axis of light which is converted to elliptical polarization at the lateral surface 332b and the lateral surface 332d are inclined by 90°. That is, light which is reflected at the lateral surfaces 332 and extracted from the light extraction surface 331 is superposition of elliptically-polarized light whose principal axes are inclined by 90°. Therefore, reflected light at the lateral surface 332a and the lateral surface 332c and reflected light at the lateral surface 332b and the lateral surface 332d are superposed such that the polarization degree is reduced. Thus, the polarization degree of overall light which is extracted from the nitride-based semiconductor light-emitting element 300 can be reduced.

Figure 11:
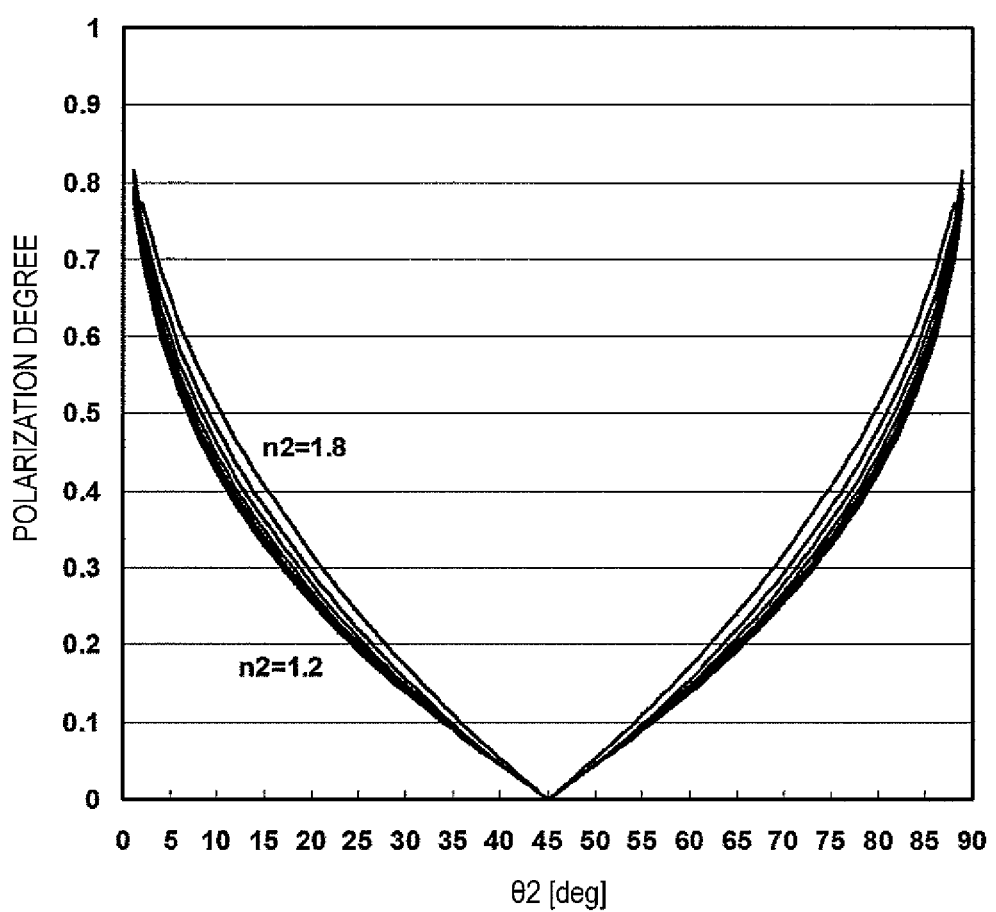
FIG. 11 is a graph showing calculation results of the polarization degree in the case where four lateral surfaces 332 in Embodiment 1 are considered.

FIG. 11 shows calculation results of the relationship between the polarization degree of the reflected light 342 and θ2 in the case where the effects of the four lateral surfaces 332a, 332b, 332c, and 332d are considered and θ1 is equal to the critical angle θc. n2 is varied from 1.2 to 1.8 with intervals of 0.1. It can be understood that the polarization degree can be greatly reduced as compared with FIG. 8(c), because the reflected light at the lateral surface 332a and the lateral surface 332c and the reflected light at the lateral surface 332b and the lateral surface 332d function so as to reduce the polarization degree. θ2 may be in the range from 25° to 65°. When θ2 is in this range, the polarization degree of the reflected light can be reduced to a level which is not more than 0.2. More specifically, θ2 may be in the range from 35° to 55°. When θ2 is in this range, the polarization degree of the reflected light can be reduced to a level which is not more than 0.1. More specifically, θ2 may be in the range from 40° to 50°. When θ2 is in this range, the polarization degree of the reflected light can be reduced to a level which is not more than 0.05. When θ2 is 45°, the polarization degree of light reflected at the lateral surfaces 332 can be generally 0 (zero). As the refractive index n2 decreases, the polarization degree also decreases. However, it can be seen from the comparison with FIG. 8C that the dependence of the polarization degree on n2 is small.

It can be understood from the above that, in the embodiment, light is allowed to be reflected at the lateral surfaces 332 such that the light is converted to elliptical polarization, and elliptically-polarized light whose principal axes are inclined by 90° are synthesized, whereby the polarization degree of light emitted from the nitride-based semiconductor light-emitting element 300 can be greatly reduced.

(Case where all of the Light Extraction Surfaces are Considered)

Lastly, the polarization degree for a case where all of the light extraction surfaces are considered is discussed. That is, light outgoing from the light extraction surface 331 is considered in addition to the light reflected at the four lateral surfaces 332a, 332b, 332c, and 332d.

Light which is emitted from the nitride semiconductor active layer 306 and directly extracted from the light extraction surface 331 to the outside maintains its polarization and impedes reduction of the polarization degree. The amount of light which is directly extracted from the light extraction surface 331 to the outside strongly depends on the critical angle θc and on the area ratio of the light extraction surface 331 to the lateral surfaces 332. Here, the critical angle θc is determined by the refractive indices n1 and n2. On the other hand, the area ratio is determined by the length of one side of the principal surface 333, L1, the length of one side of the light extraction surface 331, L2, and the distance between the light extraction surface 331 and the principal surface of the semiconductor multilayer structure, D.

Here, assuming that the angle θ1 that is formed between the normal direction of the principal surface and the lateral surfaces 332 is θc and n1 is 2.5 of a gallium nitride, L2 is determined by L1, D, and θc, and θc is determined by n2. Therefore, it is not necessary to consider L2. This means that, if the refractive index n2 of a material which overmolds the nitride-based semiconductor element is determined, the parameters that determine the contour of the nitride-based semiconductor element are D and L1.

Figure 12A:
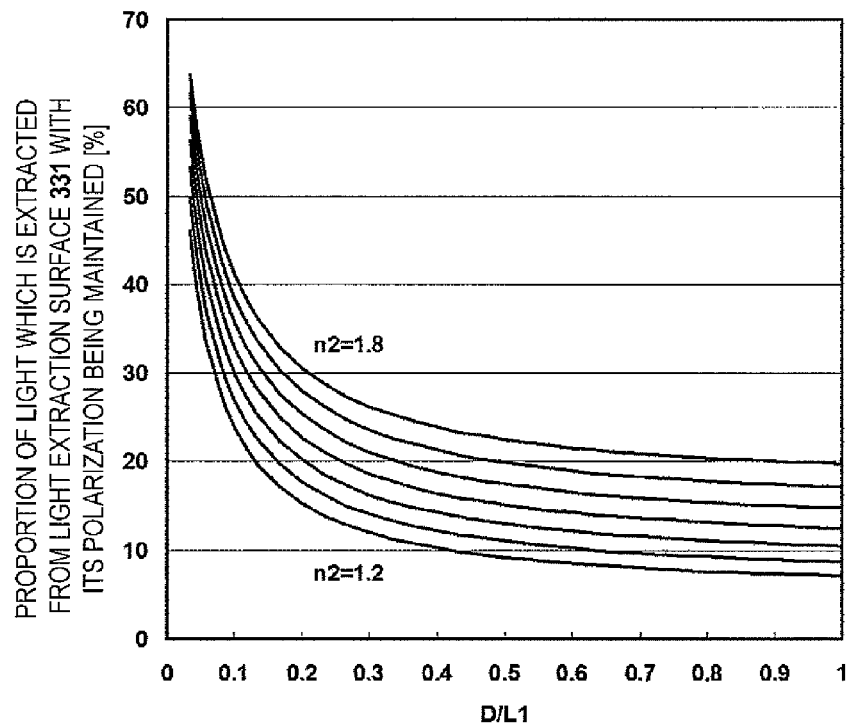
FIG. 12A is a graph showing results of calculation of how the proportion of light which is extracted from the light extraction surface 331 to the outside with its polarization being maintained depends on D/L1 and n2.

Hereinafter, the discussion is carried on with n2 and D/L1, which is the ratio of D to L1, as the parameters. FIG. 12A shows how the proportion of light which is extracted from the light extraction surface 331 to the outside with its polarization being maintained depends on D/L1 and n2. The calculation was carried out with n2 being varied from 1.2 to 1.8 with intervals of 0.1. As D/L1 increases, or as n2 decreases, the proportion of light which is extracted from the light extraction surface 331 to the outside with its polarization being maintained decreases. As seen from FIG. 11, it can be said that the polarization degree of reflected light at the lateral surfaces 332 has a small dependence on n2, but light which is directly extracted from the light extraction surface 331 depends on n2. D/L1 may be not less than 0.1 or may be not less than 0.2.

Next, the area of the nitride semiconductor active layer 306 is discussed. According to the present embodiment, the length of one side of the principal surface 333, L1, may be smaller than the length of one side of the light extraction surface 331, L2. This means that the area of a portion in which the nitride semiconductor active layer 306 is provided is small relative to the area of the substrate 304. This means that, when the nitride-based semiconductor light-emitting element shown in FIG. 3 and the nitride-based semiconductor light-emitting element of the present embodiment are compared with respect to an identical substrate area, the electric current density is higher in the configuration of the present embodiment. In other words, the above means that when the nitride-based semiconductor light-emitting element shown in FIG. 3 and the nitride-based semiconductor light-emitting element of the present embodiment are compared with respect to an identical electric current density, a larger substrate area is necessary in the configuration of the present embodiment.

Figure 13:
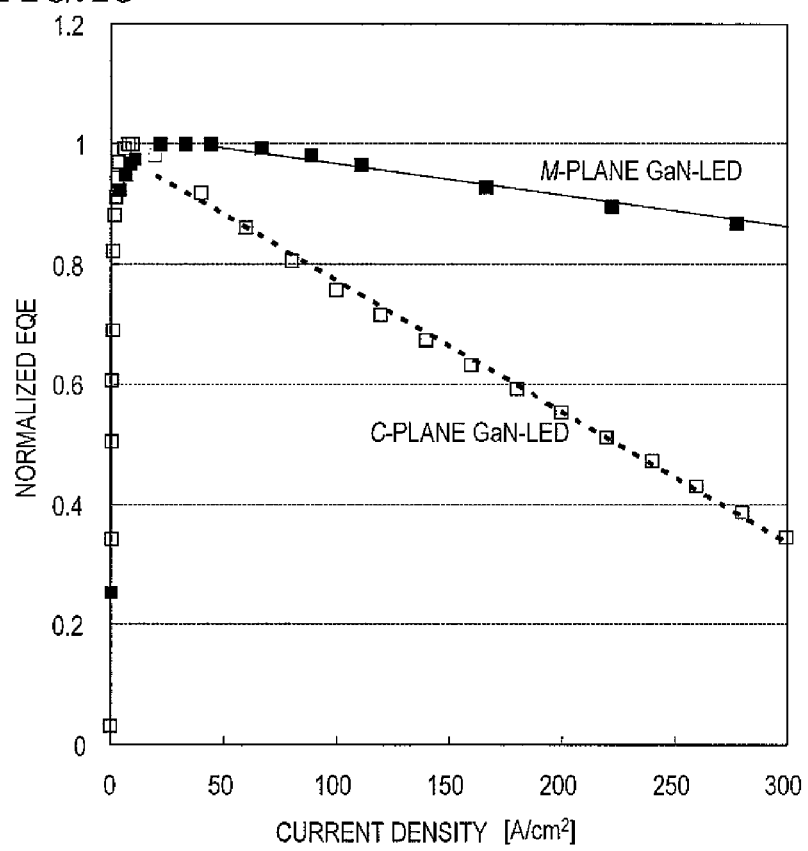
FIG. 13 is a graph showing measurement results of the electric current density and the external quantum efficiency EQE of a nitride-based semiconductor light-emitting element whose principal surface is a c-plane and a nitride-based semiconductor light-emitting element whose principal surface is an m-plane.
Figure 14A:
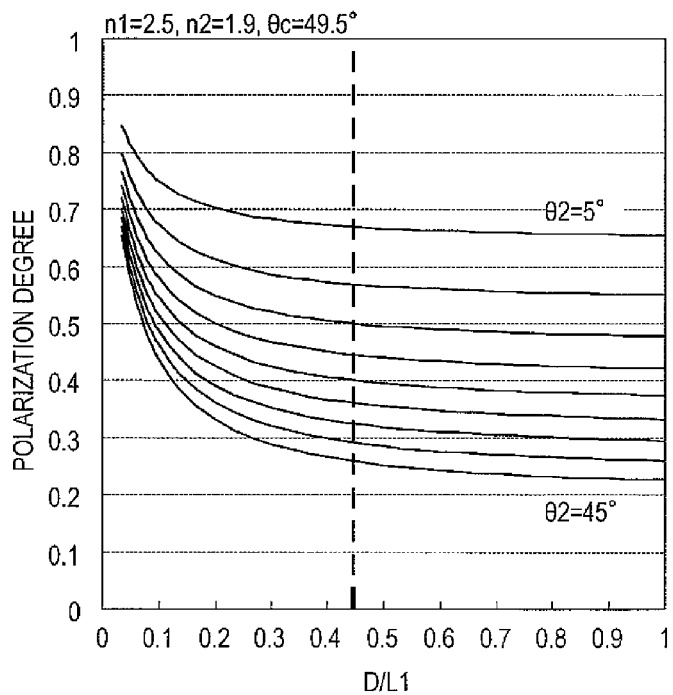
FIG. 14A is a graph showing calculation results of the polarization degree in the case where all of the light extraction surfaces in Embodiment 1 are considered and the refractive index n2 is 1.9.
Figure 14B:
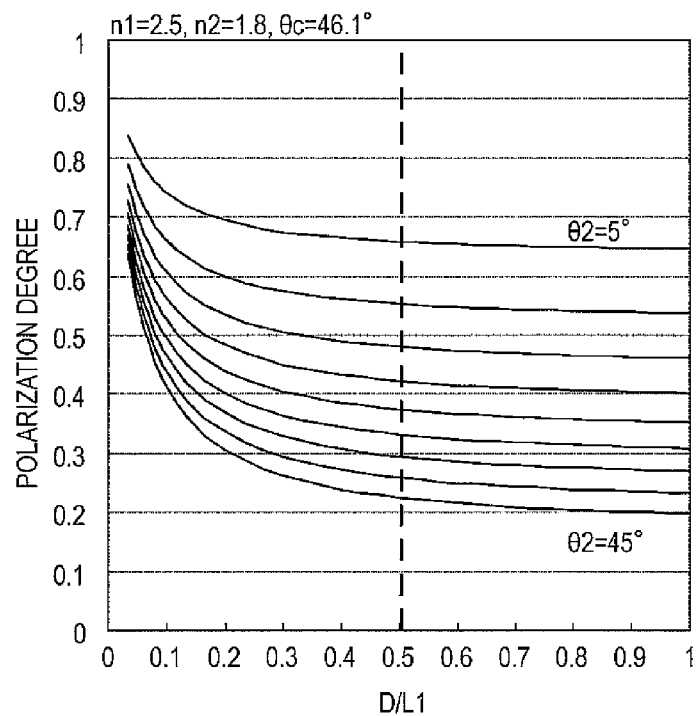
FIG. 14B is a graph showing calculation results of the polarization degree in the case where all of the light extraction surfaces in Embodiment 1 are considered and the refractive index n2 is 1.8.
Figure 14C:
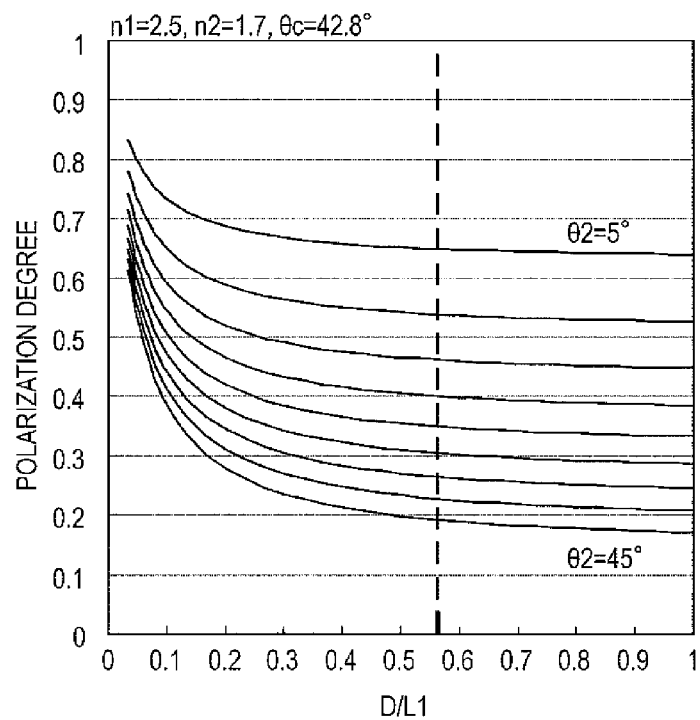
FIG. 14C is a graph showing calculation results of the polarization degree in the case where all of the light extraction surfaces in Embodiment 1 are considered and the refractive index n2 is 1.7.
Figure 14D:
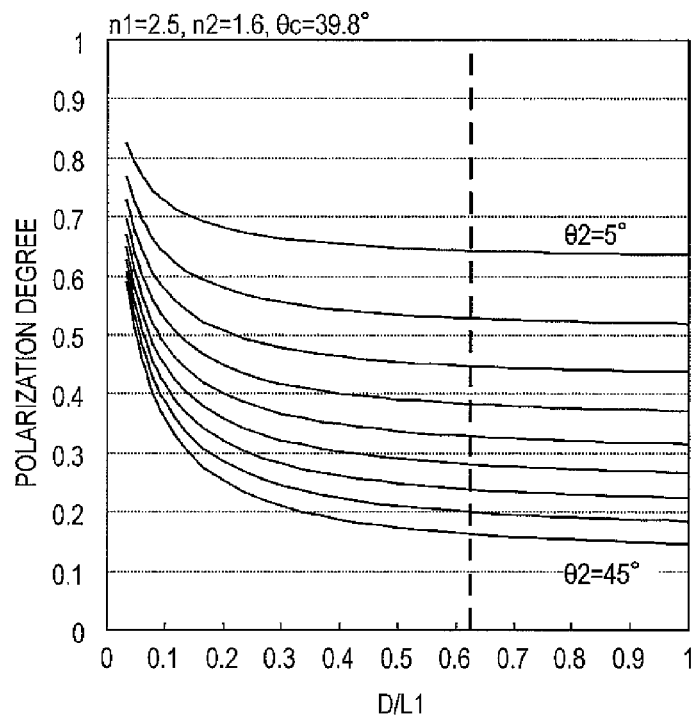
FIG. 14D is a graph showing calculation results of the polarization degree in the case where all of the light extraction surfaces in Embodiment 1 are considered and the refractive index n2 is 1.6.
Figure 14E:
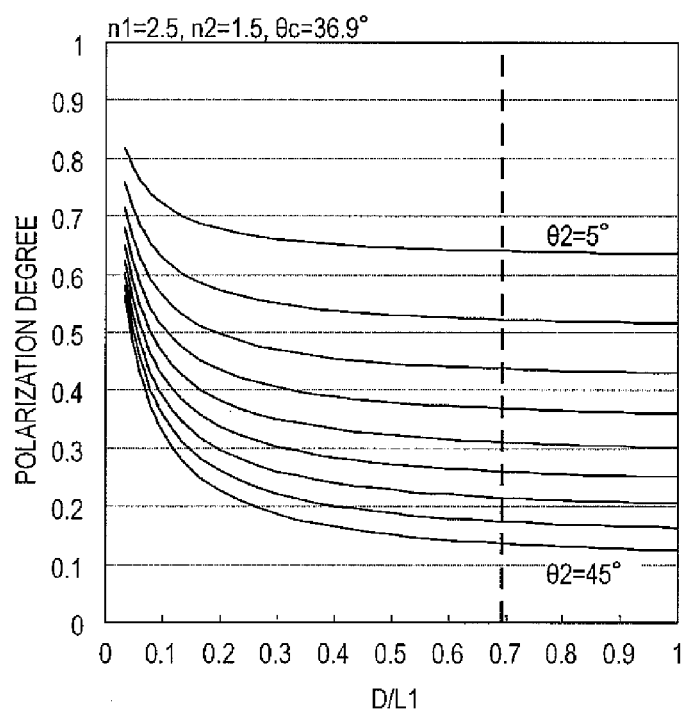
FIG. 14E is a graph showing calculation results of the polarization degree in the case where all of the light extraction surfaces in Embodiment 1 are considered and the refractive index n2 is 1.5.
Figure 14F:
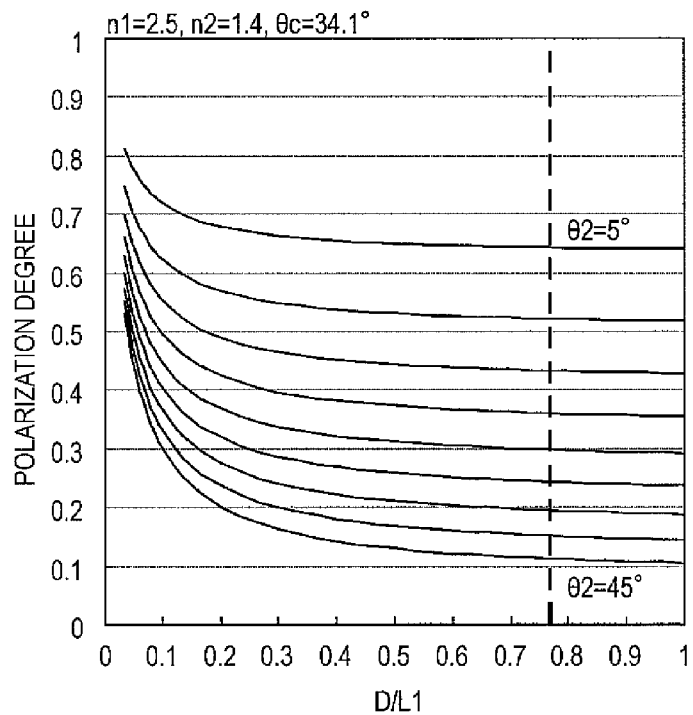
FIG. 14F is a graph showing calculation results of the polarization degree in the case where all of the light extraction surfaces in Embodiment 1 are considered and the refractive index n2 is 1.4.
Figure 14G:
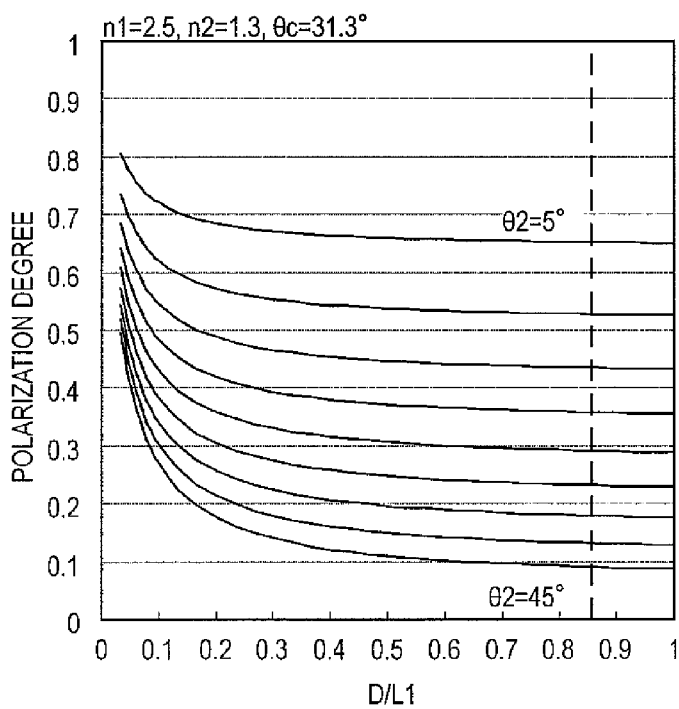
FIG. 14G is a graph showing calculation results of the polarization degree in the case where all of the light extraction surfaces in Embodiment 1 are considered and the refractive index n2 is 1.3.
Figure 14H:
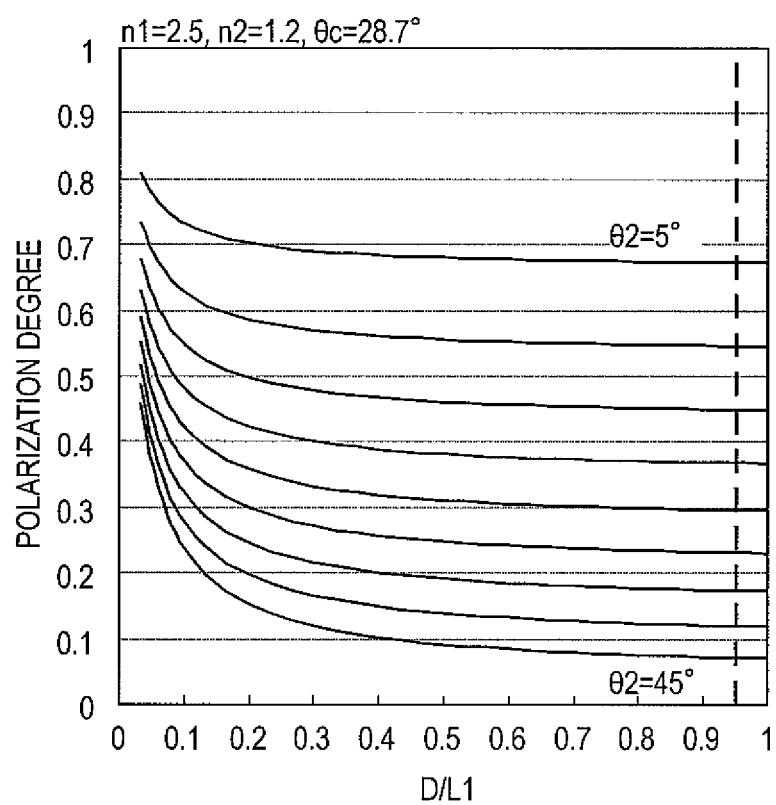
FIG. 14H is a graph showing calculation results of the polarization degree in the case where all of the light extraction surfaces in Embodiment 1 are considered and the refractive index n2 is 1.2.

On the other hand, comparing with a case where the principal surface of the nitride-based semiconductor light-emitting element is a polar plane (c-plane), the present embodiment can realize a configuration which is also advantageous in respect of the electric current density or the substrate area. This is because a nitride-based semiconductor light-emitting element whose principal surface is a non-polar plane or a semi-polar plane is characterized in that the efficiency is maintained even in the case of a high electric current density. FIG. 13 shows experimental results which illustrate the electric current density dependence of the external quantum efficiency (EQE) of a nitride-based semiconductor light-emitting element whose principal surface is an m-plane and a nitride-based semiconductor light-emitting element whose principal surface is a c-plane. The values of the EQE were normalized with the maximum value. These nitride-based semiconductor light-emitting elements were manufactured using a manufacturing method which will be described later. The configuration of the nitride-based semiconductor light-emitting elements is the same as that shown in FIG. 3. θ1 and θ2 are 0°. In the nitride-based semiconductor light-emitting element manufactured on an m-plane GaN substrate, decrease of the EQE is small even in the case of a high electric current density. In view of the conditions which realize equal EQE in FIG. 13, it can be seen that, in the nitride-based semiconductor light-emitting element manufactured on an m-plane GaN substrate, the electric current density can be increased to a level which is 4.2 times that of the nitride-based semiconductor light-emitting element which is manufactured on a c-plane GaN substrate. Here, the area occupation ratio of the nitride semiconductor active layer 306, R, is defined as Formula 10. As for the area occupation ratio R of the nitride semiconductor active layer 306, the area occupation ratio R=0.24, with which the electric current density is increased 4.2-fold, is an estimated value of the minimum. Thus, it means that, when R is not less than 0.24, a light-emitting element can be realized which is capable of high optical output as compared with a nitride-based semiconductor light-emitting element whose principal surface is a polar plane (c-plane).

$$R = \frac{L1^2}{L2^2} \qquad \text{(Formula 10)}$$

Figure 12B:
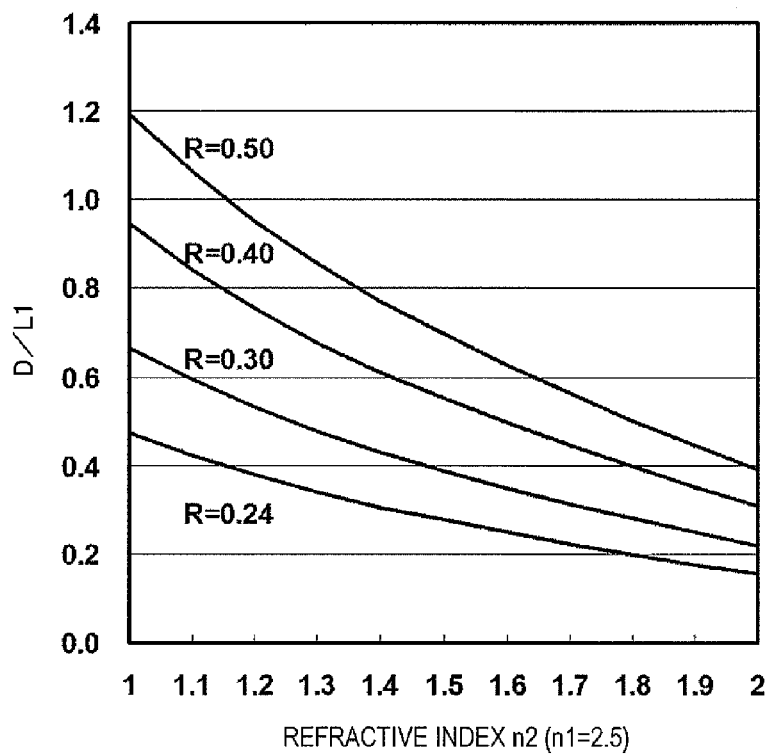
FIG. 12B is a graph showing results of calculation of the relationship between n2 and D/L1 for values of the area occupation ratio R.

FIG. 12B shows the relationship between n2 and D/L1 for respective values of the area occupation ratio R. When the area occupation ratio R is determined, the relationship between n2 and D/L1 is determined. For example, when R=0.24, D/L1 may be set to a value which is not more than 0.5. More specifically, when the nitride-based semiconductor light-emitting element is overmolded with a material whose refractive index is generally from 1.4 to 1.5, such as a silicone resin, D/L1 may be set to about 0.3.

The relationship between D/L1 and the polarization degree in a case where θ2 was varied from 5° to 45° with intervals of 5° was calculated with the refractive index n2 being varied from 1.9 to 1.2 with intervals of 0.1 based on the above calculation results. The results of the calculation are shown in FIG. 14A to FIG. 14H. The broken line shown in the graphs represents a value of D/L1 which leads to R=0.24. A region on the right side of the broken line represents a beneficial region in respect of the configuration. In FIG. 14A to FIG. 14H, the minimum value of the polarization degree is determined by light which is directly extracted from the light extraction surface 331 with its polarization being maintained. It is illustrated that the amount of the light which is directly extracted from the light extraction surface 331 with its polarization being maintained depends on D/L1, θ2, and n2.

Figure 15:
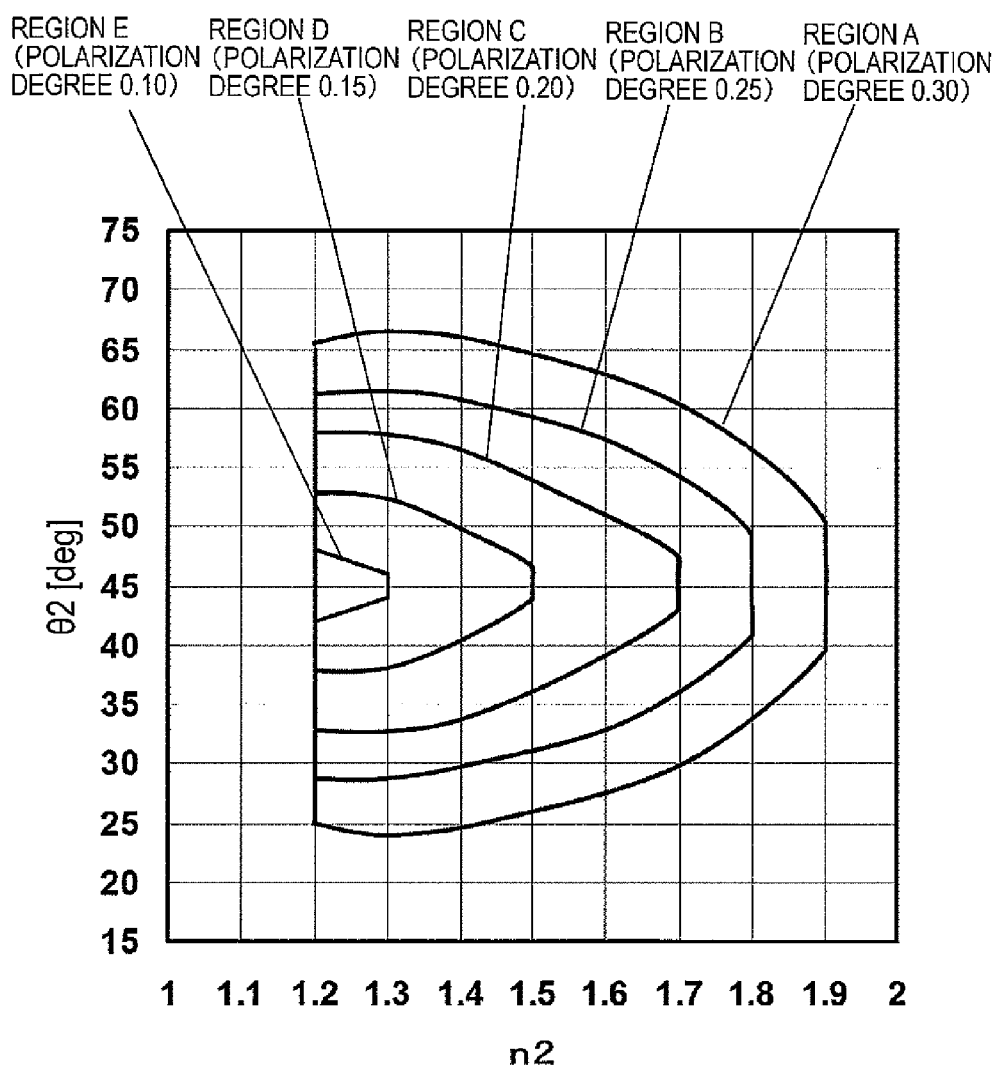
FIG. 15 is a graph showing appropriate ranges of θ2 and n2 in the case where all of the light extraction surfaces in Embodiment 1 are considered.

FIG. 15 is a graph edited from the graphs of FIG. 14A through FIG. 14H, for the sake of clarity, for a case where R is not less than 0.24 and θ1 is equal to or greater than the critical angle θc. FIG. 15 illustrates the ranges of n2 and θ2 which satisfy the following conditions: the polarization degree is not more than 0.30 (region A); the polarization degree is not more than 0.25 (region B); the polarization degree is not more than 0.20 (region C); the polarization degree is not more than 0.15 (region D); and the polarization degree is not more than 0.10 (region E). Here, the "region" includes the solid line and the entire area enclosed by the solid line. As seen from FIG. 15, θ2 may be a value which is as close to 45° as possible, and the value of n2 may be as small as possible.

The calculation results which have been described in the previous sections are calculation results which are on the assumption that light emitted from the nitride semiconductor active layer 306 is complete polarization, i.e., calculation results for light whose polarization degree is 1. As seen from FIG. 4, in an actual nitride-based semiconductor light-emitting element, the polarization degree of light emitted from the nitride semiconductor active layer 306 depends on the emission wavelength and has a value of about 0.3 to 0.8. That is, a value obtained by multiplying the value of the polarization degree of FIG. 15 by the polarization degree of light emitted from the nitride semiconductor active layer 306 is the polarization degree of the entire light-emitting element. That is, in a near-ultraviolet range where the emission wavelength is about from 400 nm to 410 nm, a polarization degree of not more than 0.1 can be realized in the region C of FIG. 15. In a blue range where the emission wavelength is about from 440 nm to 460 nm, a polarization degree of not more than 0.1 can be realized in the region E of FIG. 15.

Next, a manufacturing method of the present embodiment, i.e., Embodiment 1, is described with reference to FIG. 6.

An n-type nitride semiconductor layer 305 is epitaxially grown using an MOCVD method on a substrate 304 which is made of n-type GaN with an M-plane principal surface. For example, the n-type nitride semiconductor layer 305 which is made of GaN and which has a thickness of about not less than 1 μm and not more than 3 μm is formed at a growth temperature of not less than 900° C. and not more than 1100° C., using silicon as the n-type impurity, while TMG ($Ga(CH_3)_3$) and $NH_3$ as the source materials are supplied.

Then, a nitride semiconductor active layer 306 is formed on the n-type nitride semiconductor layer 305. The nitride semiconductor active layer 306 has a GaInN/GaN multi-quantum well (MQW) structure in which, for example, 15 nm thick $Ga_{1-x}In_xN$ well layers and 30 nm thick GaN barrier layers are alternately stacked one upon the other. In forming the $Ga_{1-x}In_xN$ well layers, the growth temperature may be decreased to 800° C. such that In can be taken in. The emission wavelength is selected according to the use for the nitride-based semiconductor light-emitting element 300, and the In mole fraction x is determined according to the wavelength. When the wavelength is 450 nm (blue), the In mole fraction x is determined to be in the range of not less than 0.18 and not more than 0.2. When the wavelength is 520 nm (green), x is not less than 0.29 and not more than 0.31. When the wavelength is 630 nm (red), x is not less than 0.43 and not more than 0.44.

A p-type nitride semiconductor layer 307 is formed on the nitride semiconductor active layer 306. For example, the p-type nitride semiconductor layer 307 which has a thickness of about not less than 50 nm and not more than 500 nm and which is made of p-type GaN is formed at a growth temperature of not less than 900° C. and not more than 1100° C., using $Cp_2Mg$ (cyclopentadienyl magnesium) as the p-type impurity, while TMG and NH$_3$ as the source materials are supplied. Inside the p-type nitride semiconductor layer 307, a p-AlGaN layer which has a thickness of about not less than 15 nm and not more than 30 nm may be included. Providing the p-AlGaN layer enables prevention of an overflow of electrons in operation.

Then, for the purpose of activating a p-GaN layer, a heat treatment is performed at a temperature of about not less than 800° C. and not more than 900° C. for about 20 minutes.

Then, dry etching is performed using a chlorine gas such that the p-type nitride semiconductor layer 307, the nitride semiconductor active layer 306, and the n-type nitride semiconductor layer 305 are partially removed to form a recessed portion 312, whereby part of the n-type nitride semiconductor layer 305 is exposed.

Here, by controlling the conditions for the dry etching, an angle formed between a lateral surface 360 of the nitride semiconductor multilayer structure which is formed by a portion of the n-type nitride semiconductor layer 305, the nitride semiconductor active layer 306, and the p-type nitride semiconductor layer 307 and the normal direction of the principal surface can be controlled. For example, when such conditions that provide a high physical etching property are employed where the etching pressure is decreased and the ion extraction voltage is increased, a lateral surface which is generally perpendicular to the light extraction surface 311 can be formed. On the other hand, when such conditions that provide a high chemical etching property are employed where an ICP plasma source of high plasma density is used and the ion extraction voltage is low, a lateral surface which is inclined with respect to the normal direction of the light extraction surface 311 can be formed.

Then, an n-side electrode 309 is formed so as to be in contact with the exposed part of the n-type nitride semiconductor layer 305. For example, Ti/Pt layers are formed as the n-side electrode 309. Further, a p-side electrode 308 is formed so as to be in contact with the p-type nitride semiconductor layer 307. For example, Pd/Pt layers are formed as the p-side electrode 308. Thereafter, a heat treatment is performed such that the Ti/Pt layers and the n-type nitride semiconductor layer 305 are alloyed together, and the Pd/Pt layers and the p-type nitride semiconductor layer 307 are also alloyed together.

Thereafter, the substrate 304 is ground so as to be a thin film. In this process, the substrate 304 is ground such that the distance between the light extraction surface 331 and the principal surface of the semiconductor multilayer structure, D, has an intended value.

The thus-manufactured nitride-based semiconductor light-emitting element 300 is separated into small chips. By the separation process, θ1 and θ2 can be controlled. For the separation process, laser dicing, cleaving or blade dicing may be used.

Figure 16:
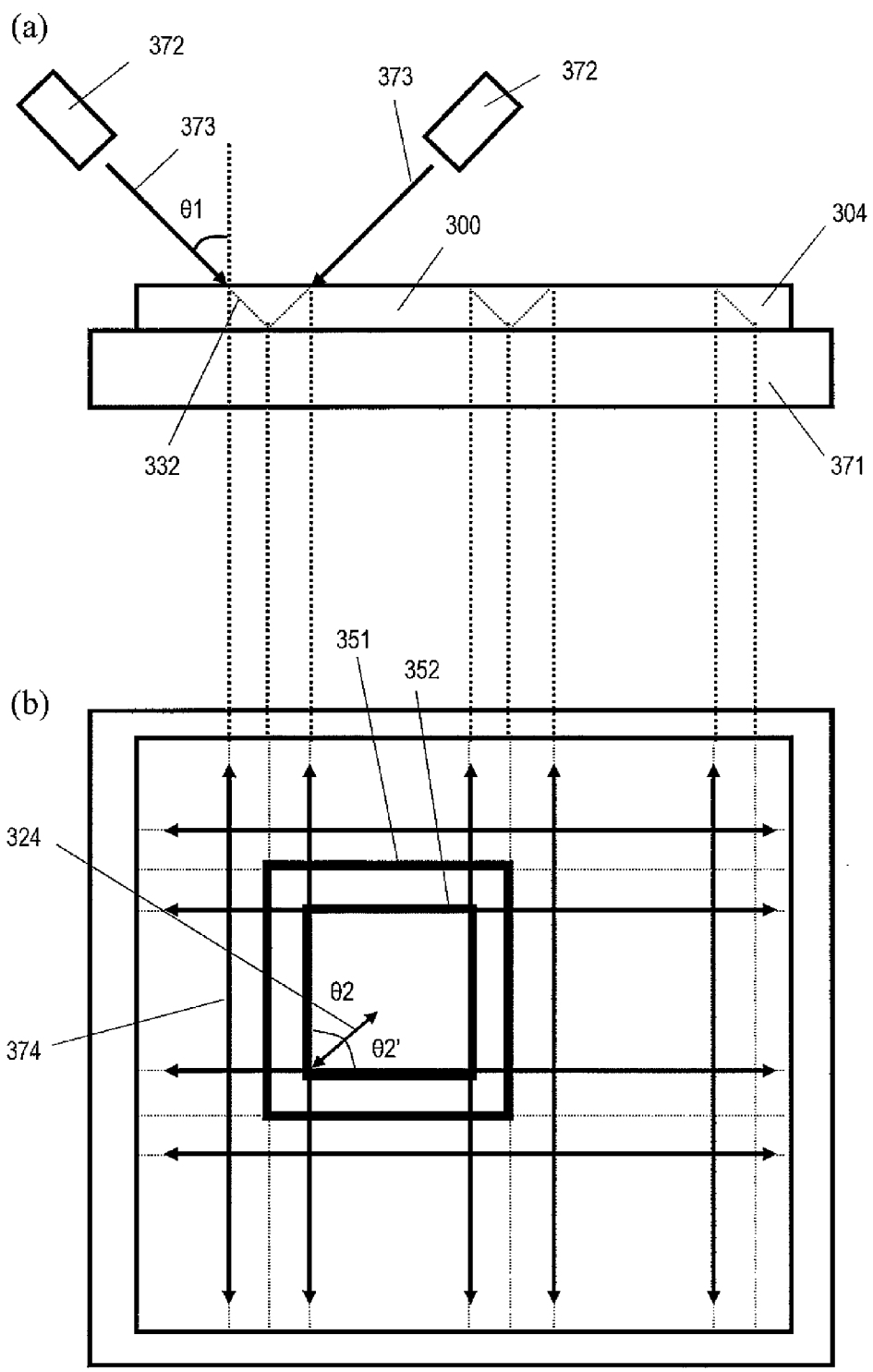
FIGS. 16(a) and 16(b) are diagrams for illustrating a manufacturing method of Embodiment 1 in which laser dicing is employed.

FIGS. 16(a) and 16(b) illustrate a method for forming the lateral surfaces 332 by means of laser dicing. FIG. 16(a) is a cross-sectional view. FIG. 16(b) is a top view. As illustrated in the cross-sectional view of FIG. 16(a), after the substrate 304 is attached to a dicing tape 371, a laser light source 372 is placed obliquely with respect to the normal direction of the substrate 304 and is driven such that laser light 373 is incident obliquely with respect to the normal direction of the substrate 304. Here, the angle which is formed between the laser light 373 and the normal direction of the substrate 304 is θ1. The substrate material is melted by the laser light 373, whereby the substrate is separated into small chips. In this process, the lateral surfaces 332 are formed. The laser light may be provided so as to reach the dicing tape 371. As illustrated in the top view of FIG. 16(b), the scanning direction 374 of the laser light 373 is set so as to form an angle of θ2 (θ2') with respect to the polarization direction 324 in the principal surface of polarized light emitted from the nitride semiconductor active layer 306. In the laser dicing, it is necessary to perform laser light scanning at least four times for formation of the four lateral surfaces 332.

Figure 17:
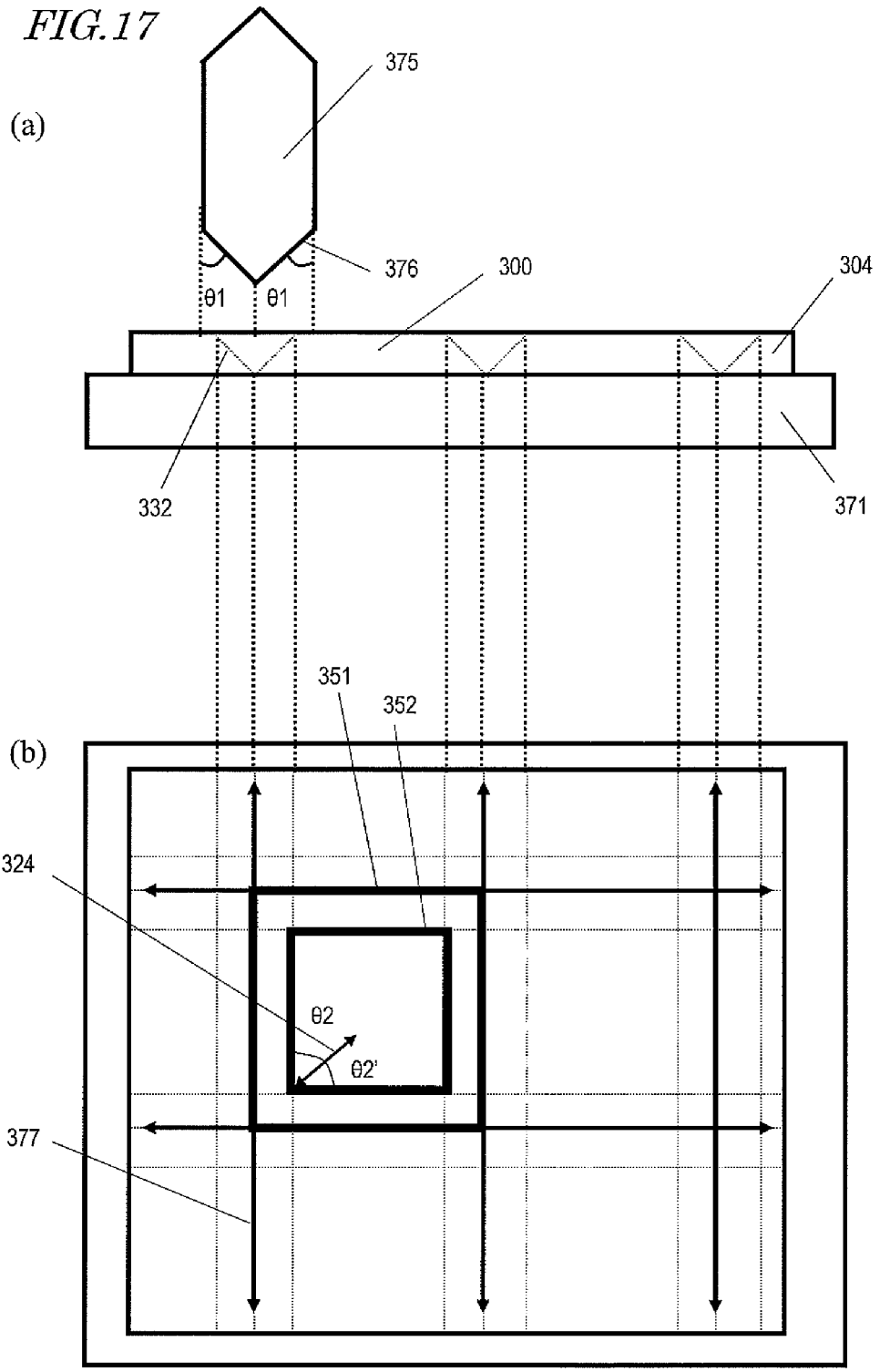
FIGS. 17(a) and 17(b) are diagrams for illustrating another manufacturing method of Embodiment 1 in which blade dicing is employed.

FIGS. 17(a) and 17(b) illustrate a method for forming the lateral surfaces 332 by means of blade dicing. FIG. 17(a) is a cross-sectional view. FIG. 17(b) is a top view. As illustrated in the cross-sectional view of FIG. 17(a), the blade dicing employs a dicing blade 375 which has slopes at the edge. Here, the settings are determines such that the angles which are formed between the slope surfaces 376 at the edge of the dicing blade and the normal direction of the principal surface of the substrate 304 are el. After the substrate 304 is attached to a dicing tape 371, dicing of the substrate 304 is carried out such that the shape of the slope surfaces 376 at the dicing blade edge is transferred to the substrate 304, whereby the lateral surfaces 332 are formed. As illustrated in the top view of FIG. 17(b), the scanning direction 377 of the blade dicing is set so as to form an angle of θ2 (θ2') with respect to the polarization direction 324 in the principal surface of polarized light emitted from the nitride semiconductor active layer 306. In the blade dicing, the lateral surfaces 332 of adjoining nitride-based semiconductor light-emitting elements 300 are simultaneously formed. Therefore, the blade dicing is advantageous in that the number of times of the scanning is smaller than that of the laser dicing.

According to the present embodiment, the principal surface 333 and the light extraction surface (rear surface) 331 of the substrate 304 have square shapes. Therefore, in the process of separating the nitride-based semiconductor light-emitting elements 300 into small chips, the scanning direction of laser light or cutting with a dicing blade is maintained parallel, and the manufacturing process is easy.

Figure 18A:
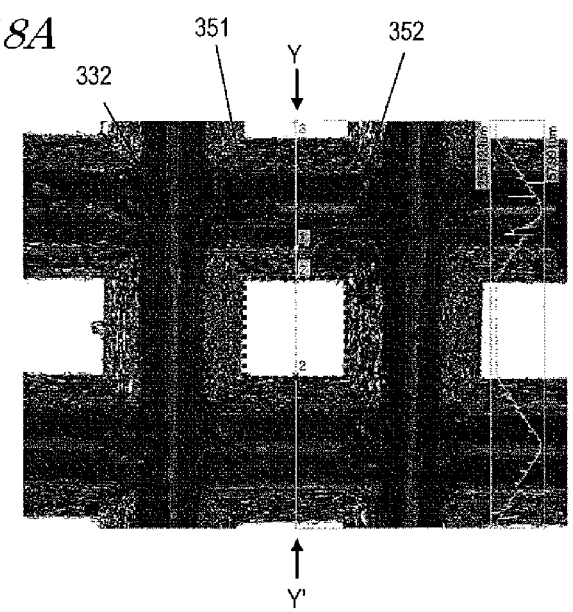
FIGS. 18A and 18B show a photographic image of the top surface and a cross-sectional profile of a nitride-based semiconductor light-emitting element which was separated into a small chip by means of blade dicing.
Figure 18B:
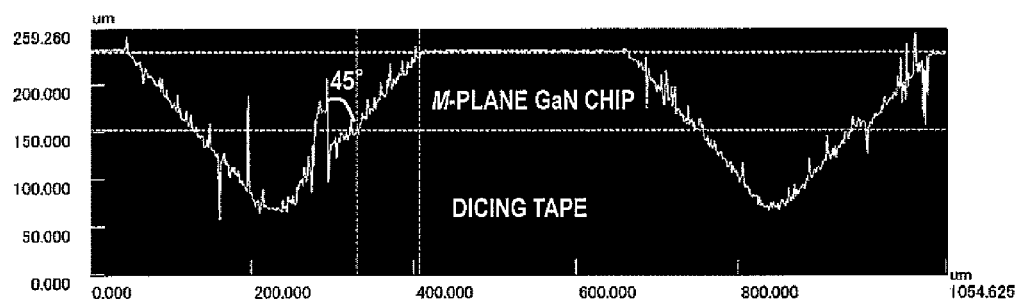

FIGS. 18A and 18B show an example where the angles formed between the slope surfaces 376 at the dicing blade edge and the normal direction of the principal surface of the substrate 304 were set to 45°, and the blade dicing was carried out on the substrate 304 which had a thickness of 100 μm. In this process, the dicing was also performed on the dicing tape, together with the substrate 304, to the depth of 100 μm. FIG. 18(a) is a photographic image of the top surface, from which it is seen that the lateral surfaces 332 were formed. FIG. 18B is a graph showing a cross-sectional profile taken along Y-Y' direction. It is seen that the angles formed between the lateral surfaces 332 and the normal direction of the principal surface were 45°, and that the slope surfaces 376 at the dicing blade edge were transferred to the substrate 304.

The nitride-based semiconductor light-emitting element 300 that has been separated into a small chip as described above is mounted on the mounting base 301. Here, a flip-chip structure is described with again reference to FIG. 6.

On the mounting base 301, the wire 302 has been formed in advance. As the base material of the mounting base, an insulating material such as alumina or AlN, a metal such as Al or Cu, a semiconductor such as Si or Ge, or a composite material thereof may be used. When the metal or semiconductor is used as the base material of the mounting base 301, the surface of the mounting base 301 may be covered with an insulating film. The wire 302 may be arranged according to the electrode shape of the nitride-based semiconductor light-emitting element 300. For the wire 302, Cu, Au, Ag or Al may be used. The wire 302 may be arranged according to the electrode shape of the nitride-based semiconductor light-emitting element 300. For the wire 302, Cu, Au, Ag or Al may be used. These materials may be provided on the mounting base 301 by sputtering or plating.

A bump 303 is formed on the wire 302. Au may be used for the bump. In forming the Au bump, a Au bump having a diameter of about not less than 50 μm and not more than 70 μm may be formed using a bump bonder. Alternatively, the Au bump may also be formed by Au plating. To the mounting base 301 on which the bump 303 has been formed in this way, the nitride-based semiconductor light-emitting element 300 is connected by ultrasonic bonding.

In this way, the semiconductor light-emitting device of the embodiment is completed.

Figure 19:
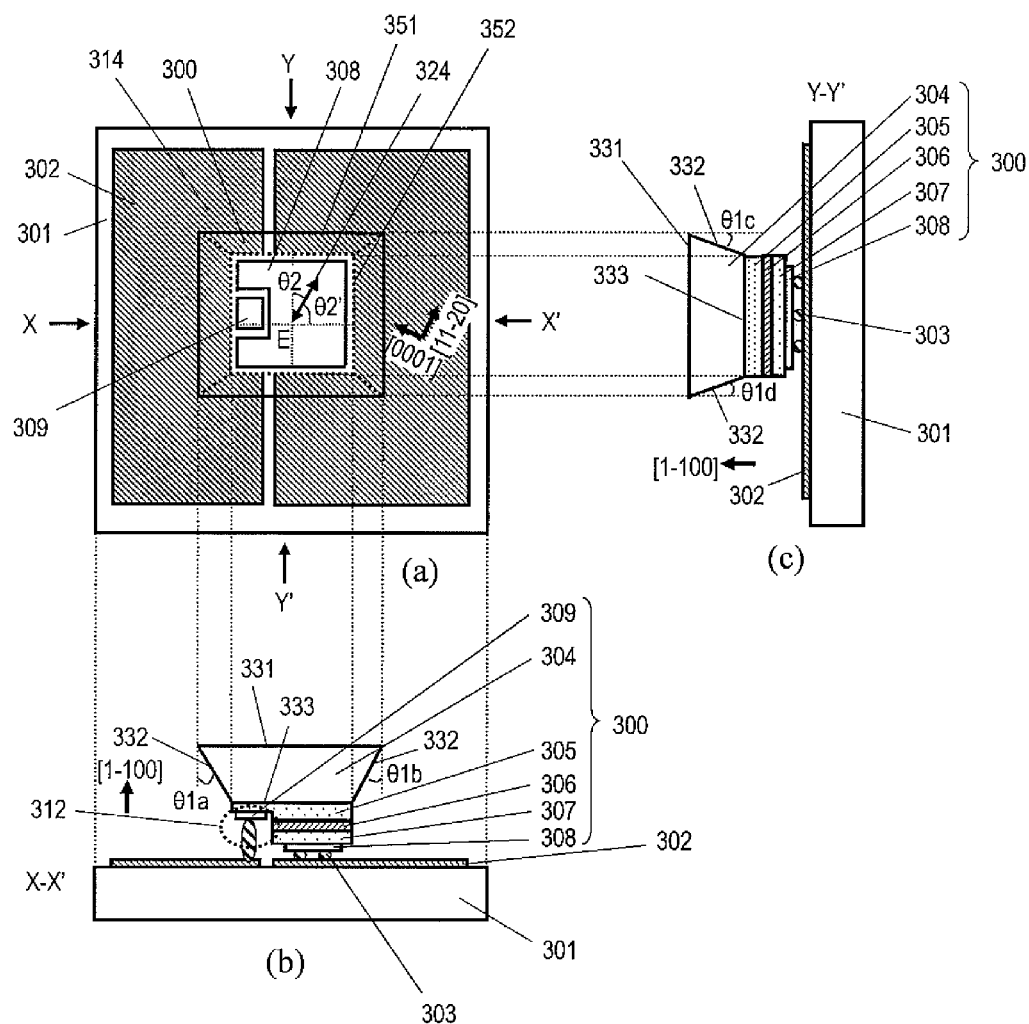
FIGS. 19(a) to 19(c) are diagrams showing a nitride-based semiconductor light-emitting element of the first variation of Embodiment 1.

FIG. 19(a) is a top view schematically showing a nitride-based semiconductor light emitting device of Variation 1 of Embodiment 1. FIG. 19(b) is a cross-sectional view taken along line X-X' of FIG. 19(a). FIG. 19(c) is a cross-sectional view taken along line Y-Y' of FIG. 19(a). Detailed descriptions of disclosures which are common among FIG. 6 and FIG. 19 are herein omitted. In the previously-described example of the first embodiment, the four angles θ1 which are formed between the normal direction of the principal surface and the four lateral surfaces 332 are equal to one another, whereas the angles θ1 are all different in Variation 1 of Embodiment 1. For example, in the case where the center of the square formed by the contour 351 of the light extraction surface 331 and the center of the square formed by the contour 352 of the principal surface 333 are not coincident with each other, the angles θ1 are different from one another. Due to the problem of machining accuracy, it is difficult to make the four angles θ1 exactly equal to one another. However, even when the angles θ1 are different from one another, the previously-described polarization reducing effect is achieved likewise. In this variation also, when the four angles θ1 (θ1a, θ1b, θ1c, and θ1d) satisfy Formula 9, the proportion of part of the light incident on the lateral surfaces 332 which is reflected at the lateral surfaces 332 and outgoing from the light extraction surface 331 can be not less than 70%. When the four angles θ1 are greater than the critical angle θc, the light can be efficiently reflected at each of the lateral surfaces. Note that, however, the four angles θ1 do not necessarily meet these conditions, but at least one of the angles θ1 may meet these conditions.

Figure 20:
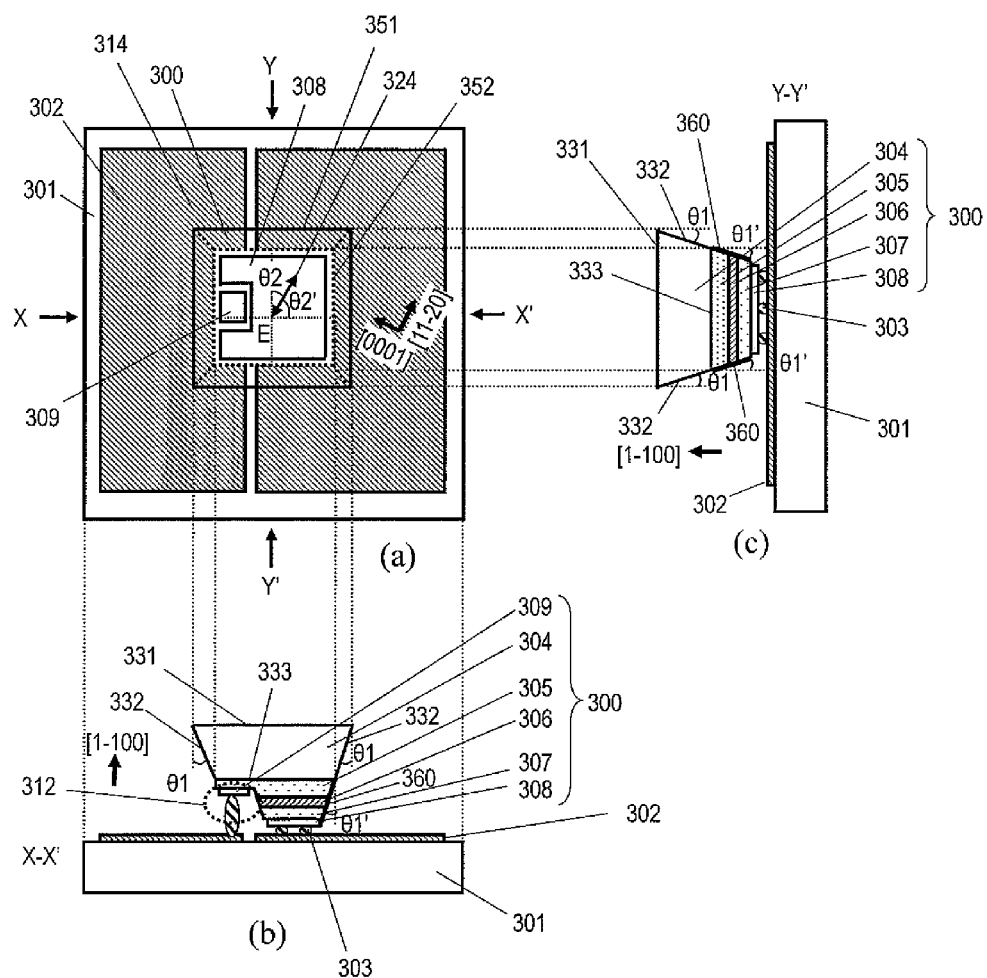
FIGS. 20(a) to 20(c) are diagrams showing a nitride-based semiconductor light-emitting element of the second variation of Embodiment 1.

FIG. 20(a) is a top view schematically showing a nitride semiconductor light-emitting device of Variation 2 of Embodiment 1. FIG. 20(b) is a cross-sectional view taken along line X-X' of FIG. 20(a). FIG. 20(c) is a cross-sectional view taken along line Y-Y' of FIG. 20(a). Detailed descriptions of disclosures which are common among FIGS. 6 and FIG. 20 are herein omitted. In the previously-described example of the first embodiment shown in FIG. 6, the lateral surfaces 360 of the nitride semiconductor multilayer structure which is formed by the n-type nitride semiconductor layer 305, the nitride semiconductor active layer 306, and the p-type nitride semiconductor layer 307 are parallel to the normal direction of the principal surface. However, as shown in FIG. 20, the lateral surfaces 360 of the nitride semiconductor multilayer structure which is formed by the n-type nitride semiconductor layer 305, the nitride semiconductor active layer 306, and the p-type nitride semiconductor layer 307 may be inclined by an angle of θ1' with respect to the normal direction of the principal surface. In this case, θ1' may be greater than the value of Formula 9 or may be greater than the critical angle θc. With such an arrangement, light which is emitted from the nitride semiconductor active layer 306 and outgoing in a direction of a plane on which the semiconductor multilayer structure is formed can be efficiently totally reflected at the lateral surfaces 360 of the nitride semiconductor multilayer structure.

Figure 21:
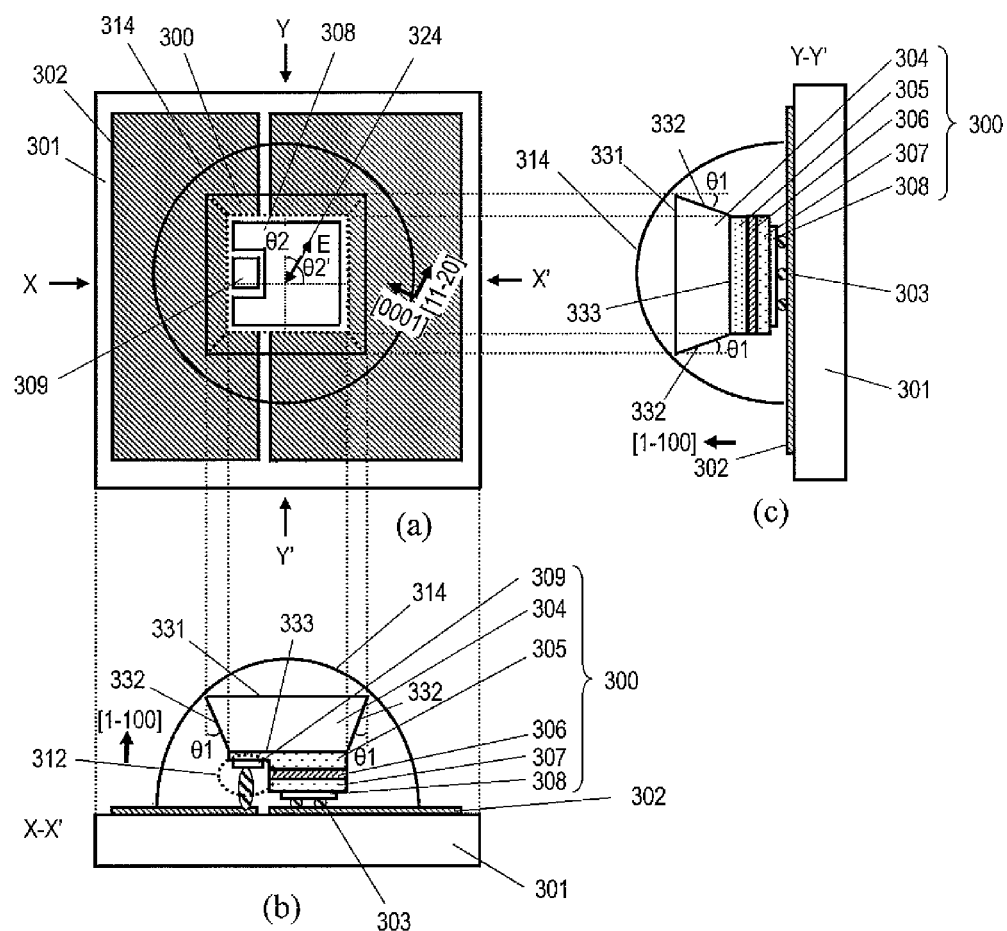
FIGS. 21(a) to 21(c) are diagrams showing a nitride-based semiconductor light-emitting element of the third variation of Embodiment 1.

FIG. 21(a) is a top view schematically showing a nitride-based semiconductor light-emitting device of Variation 3 of Embodiment 1. FIG. 21(b) is a cross-sectional view taken along line X-X' of FIG. 21(a). FIG. 21(c) is a cross-sectional view taken along line Y-Y' of FIG. 21(a). Detailed descriptions of disclosures which are common among FIG. 6 and FIG. 21 are herein omitted. The difference from FIG. 6 resides in that the nitride-based semiconductor light-emitting element is covered with an overmold portion 314. Examples of the material of the overmold portion 314 are epoxy, silicone or glass. The value of n2 can be controlled by appropriately selecting the material of the overmold portion 314. Also, by enclosing the nitride-based semiconductor light-emitting element having the overmold portion 314, light extraction is improved, and the emission power can be increased. Further, permeation of moisture and gas can be prevented, and accordingly, the reliability improves. When silicone is used as the material of the overmold portion 314 for example, the value of n2 can be controlled to a value which is not less than 1.40 and not more than 1.54. When an epoxy resin is used as the material of the overmold portion 314, for example, the value of n2 can be controlled to a value which is not less than 1.47 and not more than 1.60. These materials can be selected from thermosetting materials and UV-curable materials.

Embodiment 2

Figure 22:
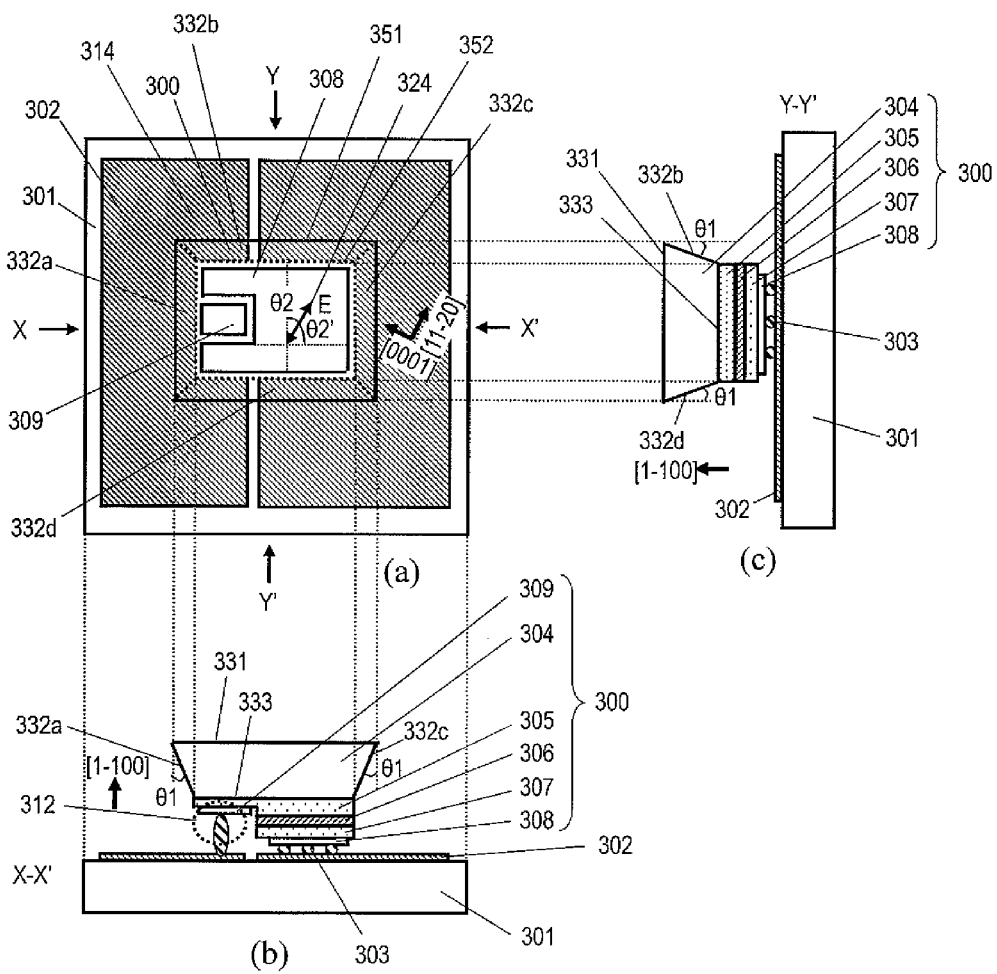
FIGS. 22(a) to 22(c) are diagrams showing a nitride-based semiconductor light-emitting element of Embodiment 2.

The second embodiment is described with reference to FIG. 22. FIG. 22(b) is a cross-sectional view taken along line X-X' of FIG. 22(a). FIG. 22(c) is a cross-sectional view taken along line Y-Y' of FIG. 22(a). Detailed descriptions of disclosures which are common among FIG. 6 and FIG. 22 are herein omitted. The difference from Embodiment 1 resides in that the contour 351 of the light extraction surface 331 and the contour 352 of the principal surface 333 have rectangular shapes in the top view. In the top view, the contour 351 and the contour 352 may be concentric, and the sides of the contour 351 and the sides of the contour 352 may be parallel to each other. The rectangular contours improve the flexibility of the electrode layout.

When the contour 351 and the contour 352 have rectangular shapes, polarized light emitted from the nitride semiconductor active layer 306 is also reflected at the lateral surfaces 332 so as to be converted to elliptical polarization. Further, elliptically-polarized light whose principal axes are inclined by 90° are synthesized, whereby the polarization degree of light outgoing from the nitride-based semiconductor light-emitting element 300 can be reduced.

Where the absolute value of an angle formed between one of the sides of the contour 351 which is selected as an angular reference and the polarization direction 324 in the principal surface of polarized light of the nitride-based semiconductor light-emitting element 300 is θ2, θ2 (mod 180°) is inclined by an angle which does not include 0° or 90°. Where the absolute value of an angle formed between a side which is in contact with the angular reference side and the polarization direction 324 in the principal surface of polarized light of the nitride-based semiconductor light-emitting element 300 is θ2', θ2'=|90°−θ2| holds true because the contour 351 is rectangular.

As is in Embodiment 1, θ2 may be in the range from 25° to 65°. When θ2 is in this range, the polarization degree of reflected light can be reduced to a level which is not more than 0.2. More specifically, θ2 may be in the range from 35° to 55°.

When θ2 is in this range, the polarization degree of reflected light can be reduced to a level which is not more than 0.1. When θ2 is 45°, the polarization degree of light reflected at the lateral surfaces 332 is the minimum.

As is in Embodiment 1, θ1 may be greater than a value which satisfies Formula 9 or may be equal to or greater than the critical angle θc, which is determined by n1 and n2. Light can be efficiently reflected at the lateral surfaces 332.

In Embodiment 2, it is desirable that the rectangular shapes and θ1 are set such that the areas of the four lateral surfaces 332a, 332b, 332c, and 332d are as equal as possible.

The same manufacturing method as that of Embodiment 1 can also be employed herein.

Embodiment 3

Figure 23:
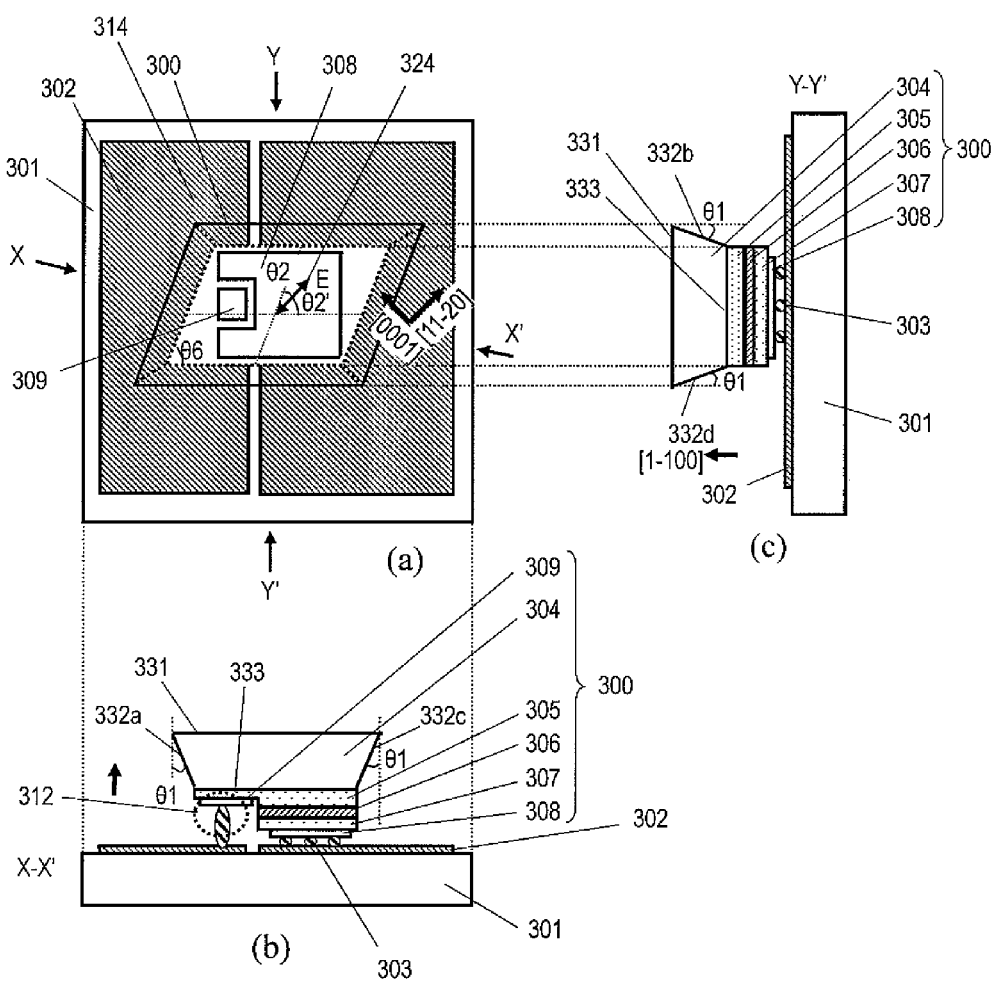
FIGS. 23(a) to 23(c) are diagrams showing a nitride-based semiconductor light-emitting element of Embodiment 3.

The third embodiment is described with reference to FIG. 23. FIG. 23(b) is a cross-sectional view taken along line X-X' of FIG. 23(a). FIG. 23(c) is a cross-sectional view taken along line Y-Y' of FIG. 23(a). Detailed descriptions of disclosures which are common among FIG. 6 and FIG. 23 are herein omitted. The difference from Embodiment 1 resides in that the contour 351 of the light extraction surface 331 and the contour 352 of the principal surface 333 have parallelogrammatic shapes in the top view. In the top view, the contour 351 and the contour 352 may be concentric, and the sides of the contour 351 and the sides of the contour 352 may be parallel to each other. The contour 351 and the contour 352 may have similar shapes. The parallelogrammatic contours improve the flexibility of the electrode layout.

Where the absolute value of an angle formed between one of the sides of the contour 351 which is selected as an angular reference and the polarization direction 324 in the principal surface of polarized light of the nitride-based semiconductor light-emitting element 300 is θ2, θ2 (mod 180°) is inclined by an angle which does not include 0° or 90°. Where the absolute value of an angle formed between a side which is in contact with the angular reference side and the polarization direction 324 in the principal surface of polarized light of the nitride-based semiconductor light-emitting element 300 is θ2', if θ6=θ2+θ2' holds true, θ6 is an interior angle of the parallelogram, and θ6 has a value which is greater than 0° and smaller than 180°.

When the contour 351 and the contour 352 have parallelogrammatic shapes, polarized light emitted from the nitride semiconductor active layer 306 is also reflected at the lateral surfaces 332 so as to be converted to elliptical polarization. Further, elliptically-polarized light whose principal axes are inclined by θ6 are synthesized, whereby the polarization degree of light outgoing from the nitride-based semiconductor light-emitting element 300 can be reduced.

θ2 and θ2' may be in the range from 25° to 65°. When θ2 and θ2' are in this range, the polarization degree of reflected light can be reduced to a level which is not more than 0.2. More specifically, θ2 and θ2' may be in the range from 35° to 55°. When θ2 and θ2' are in this range, the polarization degree of reflected light can be reduced to a level which is not more than 0.1. Particularly when θ2=θ2'=θ6/2 holds true, the polarization degree of light reflected at the lateral surfaces 332 is the minimum.

In view of the relationships of θ6=θ2+θ2' and θ2=θ2', θ6 may be in the range from 50° to 130° or may be in the range from 70° to 110°.

As is in Embodiment 1, θ1 may be greater than a value which satisfies Formula 9 or may be equal to or greater than the critical angle θc, which is determined by n1 and n2. Light can be efficiently reflected at the lateral surfaces 332.

In Embodiment 3, it is desirable that the parallelogrammatic shapes and θ1 are set such that the areas of the four lateral surfaces 332a, 332b, 332c, and 332d are as equal as possible.

Figure 24:
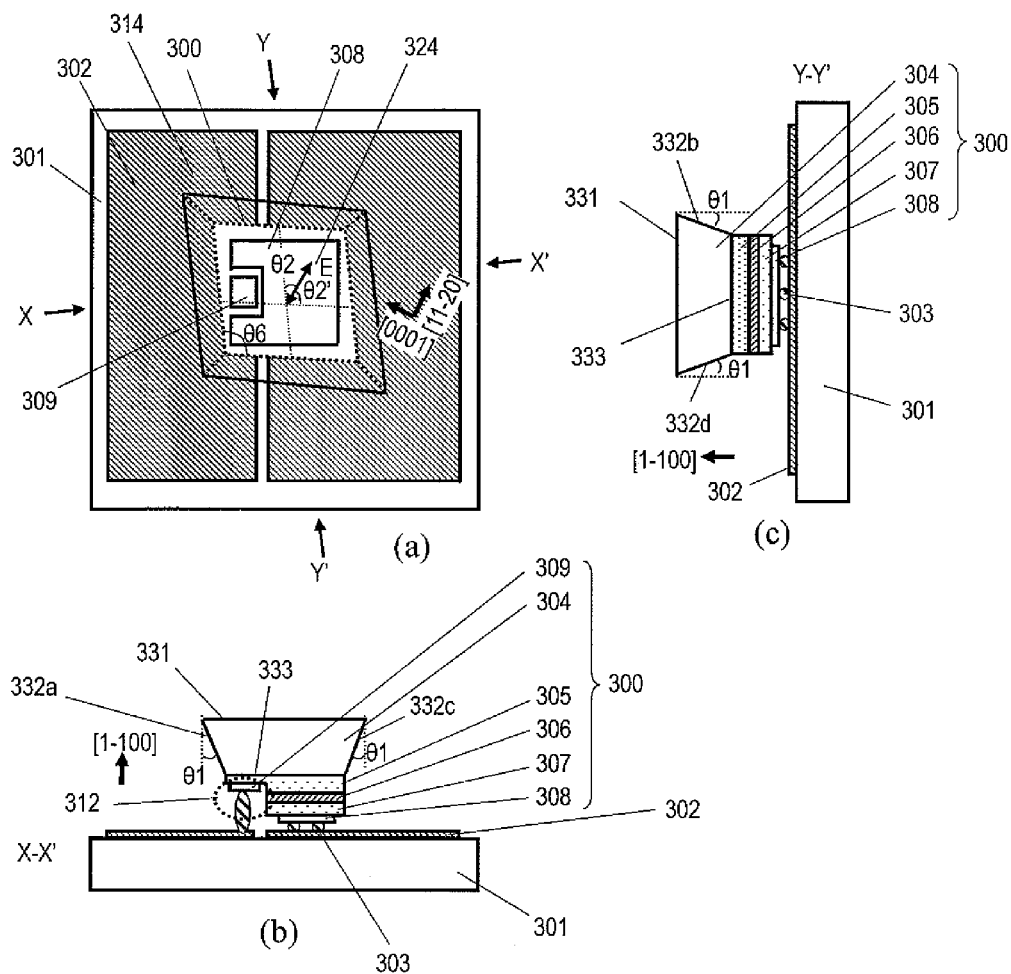
FIGS. 24(a) to 24(c) are diagrams showing a nitride-based semiconductor light-emitting element of the first variation of Embodiment 3.

FIG. 24(a) is a top view schematically showing a nitride-based semiconductor light-emitting device of Variation 1 of Embodiment 3. FIG. 24(b) is a cross-sectional view taken along line X-X' of FIG. 24(a). FIG. 24(c) is a cross-sectional view taken along line Y-Y' of FIG. 24(a). Detailed descriptions of disclosures which are common among FIG. 23 and FIG. 24 are herein omitted. In Variation 1 of Embodiment 3, the contour 351 of the light extraction surface 331 and the contour 352 of the principal surface 333 have rhombic shapes in the top view. The rhombus is a particular case of the parallelogram. All sides of the rhombus have the same length, and therefore, the areas of the four lateral surfaces 332a, 332b, 332c, and 332d can readily be equalized. That is, the amounts of light reflected at the respective lateral surfaces can readily be equalized. Thus, in synthesizing elliptically-polarized light whose principal axes are inclined by θ6, the polarization degree can be efficiently reduced.

The same manufacturing method as that of Embodiment 1 can also be employed herein for manufacture.

Embodiment 4

Figure 25:
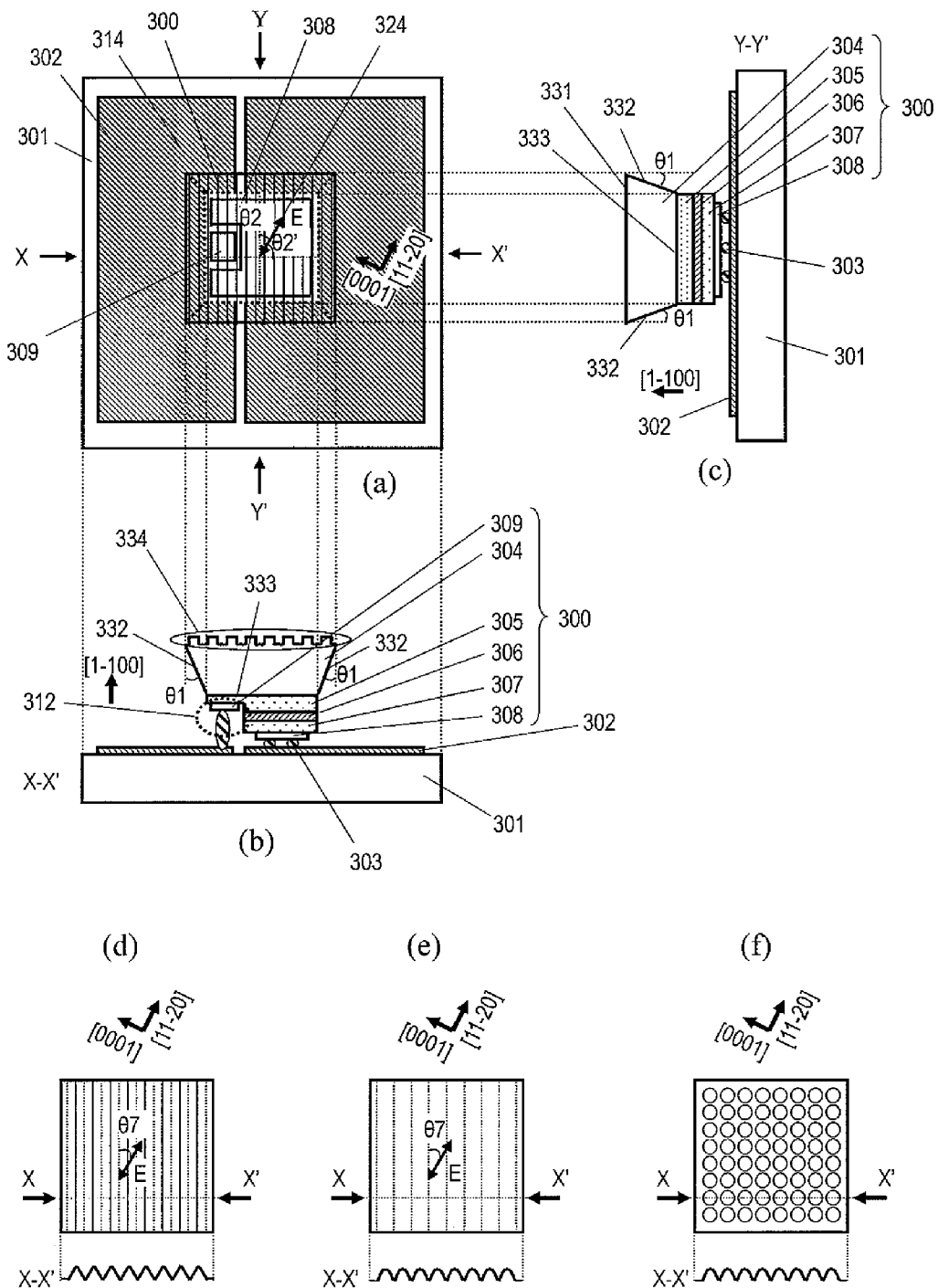
FIGS. 25(a) to 25(f) are diagrams showing a nitride-based semiconductor light-emitting element of Embodiment 4.

The fourth embodiment is described with reference to FIGS. 25(a) to 25(f). FIG. 25(b) is a cross-sectional view taken along line X-X' of FIG. 25(a). FIG. 25(c) is a cross-sectional view taken along line Y-Y' of FIG. 25(a). Detailed descriptions of disclosures which are common among FIG. 6 and FIG. 25 are herein omitted. The difference from Embodiment 1 resides in that the light extraction surface 331 has a plurality of recesses and elevations 334. In the present embodiment, the surface that has the recesses and elevations 334 can be called "patterned surface".

One of the features of the present embodiment is that light is reflected at the lateral surfaces 332 so as to be converted to elliptical polarization, and further, elliptically-polarized light whose principal axes are inclined by 90° are synthesized, whereby the polarization degree of light outgoing from the nitride-based semiconductor light-emitting element 300 can be greatly reduced. Another one of the features is that the polarization degree of light which is directly extracted from the light extraction surface 331 can be reduced using the recesses and elevations formed in the light extraction surface 331. With these features, the polarization degree of light extracted to the outside of the nitride-based semiconductor light-emitting element can be made close to generally 0 (zero).

In the present embodiment, elevated portions which have a rectangular cross-sectional shape may be provided in a striped pattern across the light extraction surface 331 as shown in FIG. 25(b). More specifically, elevated portions which have a cross-sectional shape defined by a triangle or a curve line may be provided in a striped pattern across the light extraction surface 331 as shown in FIGS. 25(d) and 25(e). The period of the plurality of elevated portions may be not less than 300 nm and not more than 8 μm. This is because when the period of the elevated portions is less than 300 nm, light is less likely to be affected by the recesses and elevations 334, and when the period of the elevated portions is more than 8 μm, the number of elevated portions formed across the light extraction surface 331 is small. In the top view, where the absolute value of an angle which is formed between the extending direction of the stripes and the polarization direction of polarized light is θ7, θ7 (mod 180°) may be not less than 5° and not more than 175°. More specifically, θ7 (mod 180°) may be not less than 30° and not more than 150°. With this angular range, the polarization can be reduced more effectively.

Another example of the plurality of recesses and elevations may be a configuration in which a plurality of elevated portions are two-dimensionally arranged as shown in FIG. 25(f). The shape of these two-dimensionally arranged elevated portions may be a conical shape or a hemispherical shape. These two-dimensionally arranged elevated portions may not be arranged with equal intervals.

Figure 26:
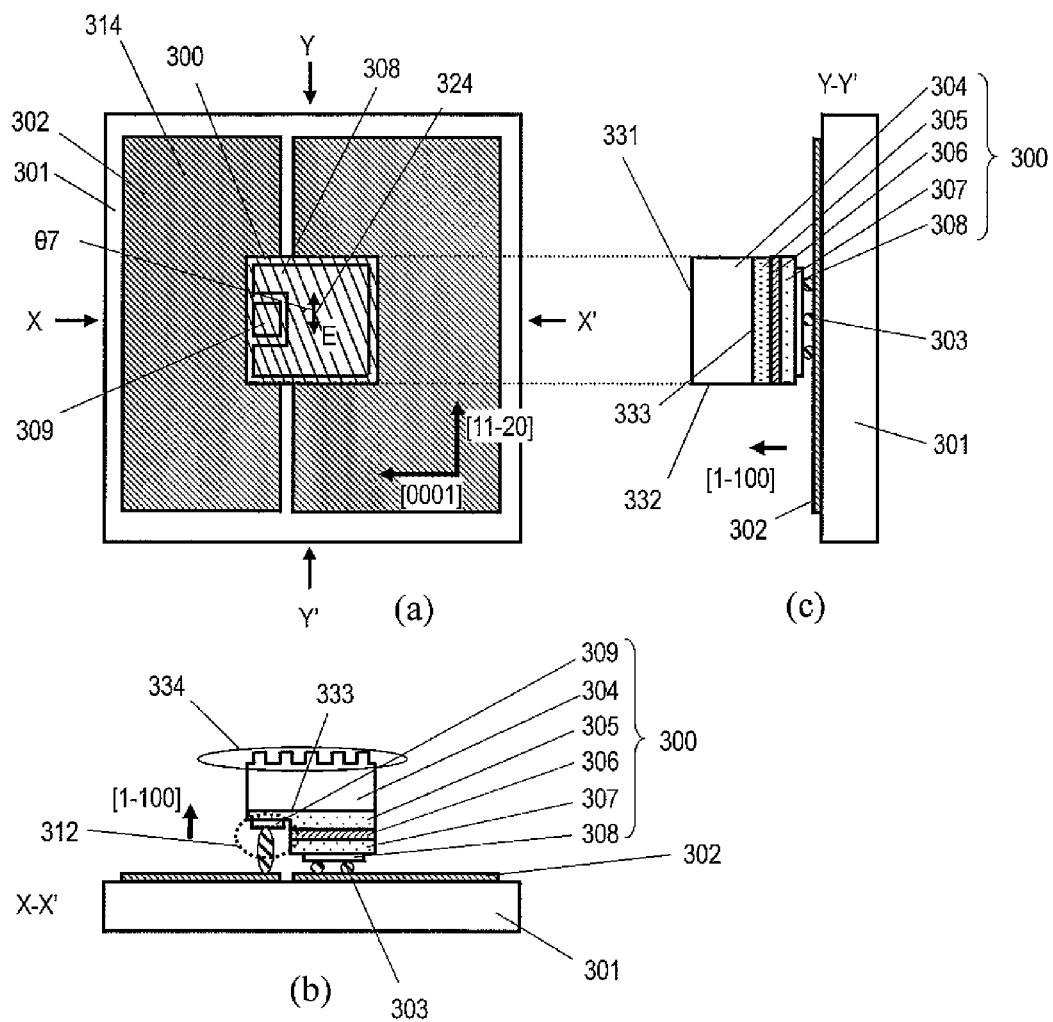
FIGS. 26(a) to 26(c) are diagrams showing a nitride-based semiconductor light-emitting element having an m-plane principal surface, in which a light extraction surface 331 has striped recesses and elevations.
Figure 27:
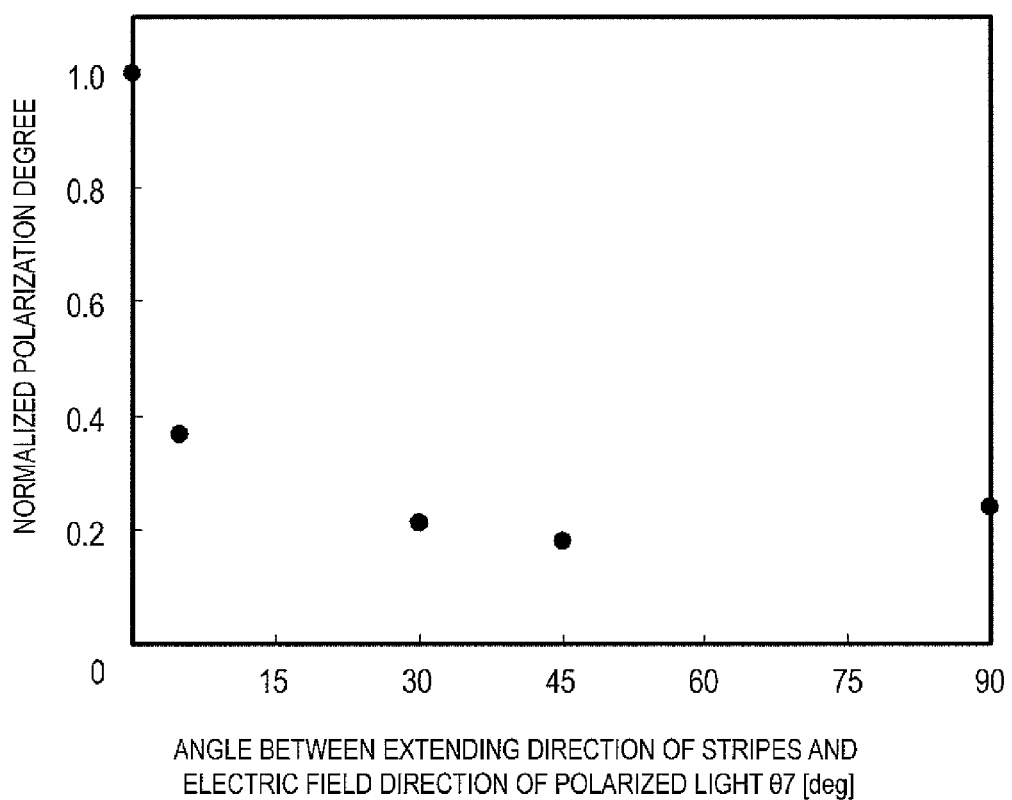
FIG. 27 is a graph showing measurement results of the polarization degree in the case where a light extraction surface 331 of a nitride-based semiconductor light-emitting element having an m-plane principal surface has striped recesses and elevations.

To examine the effect on the polarization degree of the plurality of recesses and elevations 334 formed in a striped pattern across the light extraction surface 331, a light-emitting element shown in FIG. 26 was manufactured. The lateral surfaces 332 of the nitride-based semiconductor light-emitting element 300 were formed parallel to the c-plane and the a-plane of the nitride semiconductor crystal. The size of the nitride-based semiconductor light-emitting element 300 was a square of 300 µm. By forming the lateral surfaces 332 parallel to the c-plane and the a-plane in this way, the effect of the lateral surfaces 332 on the polarization degree was reduced, and only the effect of the recesses and elevations 334 was evaluated. The cross-sectional shape of the recesses and elevations in a striped pattern was approximate to an isosceles triangle. The interval of the elevations was 8 µm, and the height of the elevations was 2.5 µm. Measurement results of the normalized polarization degree with the absolute value of an angle which is formed between the extending direction of the stripes and the electric field direction of polarized light (the a-axis direction of the nitride semiconductor crystal), θ7, being varied to be 0°, 5°, 30°, 45°, and 90° are shown in FIG. 27. The normalized polarization degree refers to a value normalized on the assumption that the value obtained when θ7 is 0° is 1.0. The normalized polarization degree is the minimum when θ7 is 45°. As seen from the measurement results shown in FIG. 27, the range of θ7 may be from 5° to 90°. More specifically, the range of θ7 may be from 30° to 90°. θ7 may be 45°.

Figure 28:
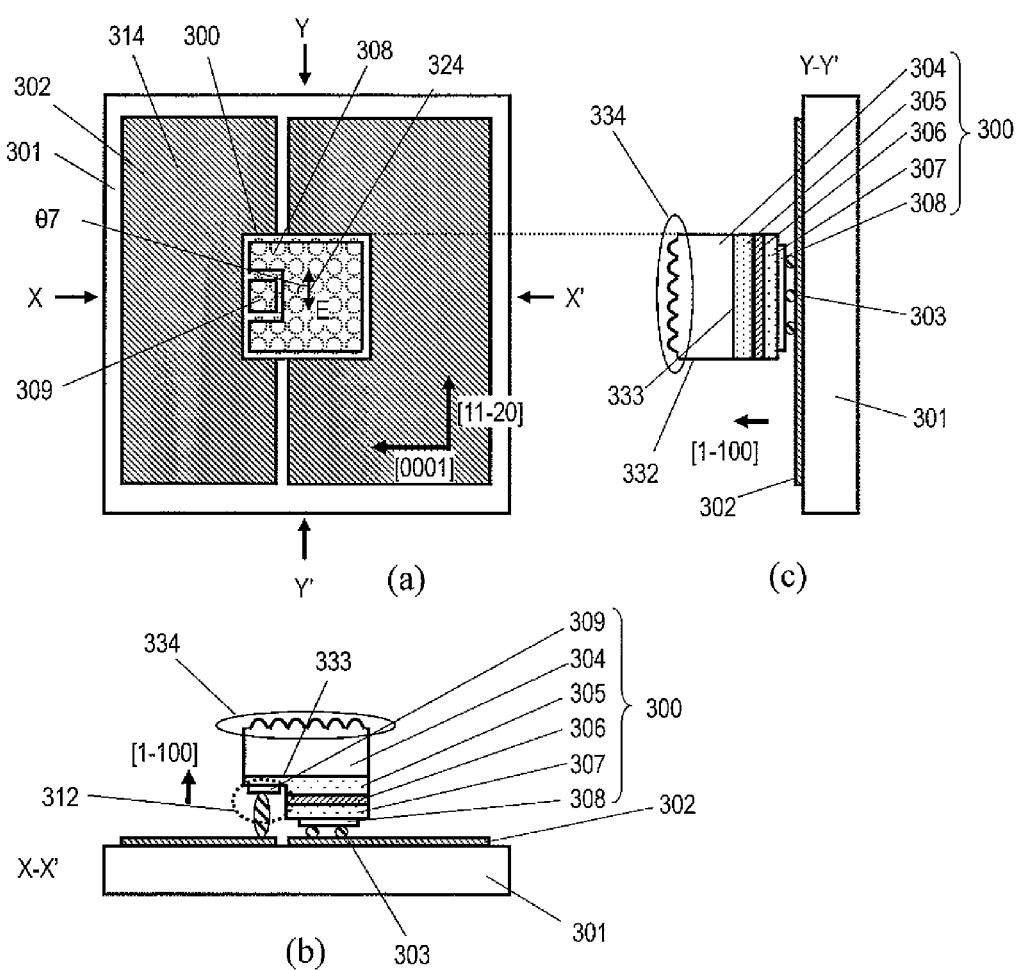
FIGS. 28(a) to 28(c) are diagrams showing a nitride-based semiconductor light-emitting element having an m-plane principal surface in which the light extraction surface 331 has recesses and elevations which have a shape approximate to a hemisphere.

To examine the effect on the polarization degree of the plurality of recesses and elevations 334 formed across the light extraction surface 331, a light-emitting element shown in FIG. 28 was manufactured. The lateral surfaces 332 of the nitride-based semiconductor light-emitting element 300 were formed parallel to the c-plane and the a-plane of the nitride semiconductor crystal. The size of the nitride-based semiconductor light-emitting element 300 was a square of 300 µm. By forming the lateral surfaces 332 parallel to the c-plane and the a-plane in this way, the effect of the lateral surfaces 332 on the polarization degree was reduced, and only the effect of the recesses and elevations 334 was evaluated. The shape of the elevated portions was approximate to a hemisphere. The height of the elevated portions was 5 µm. The base of the elevated portions had a circular shape having the diameter of 10 µm. The elevated portions were in a lattice arrangement having intervals of 20 µm.

Figure 29:
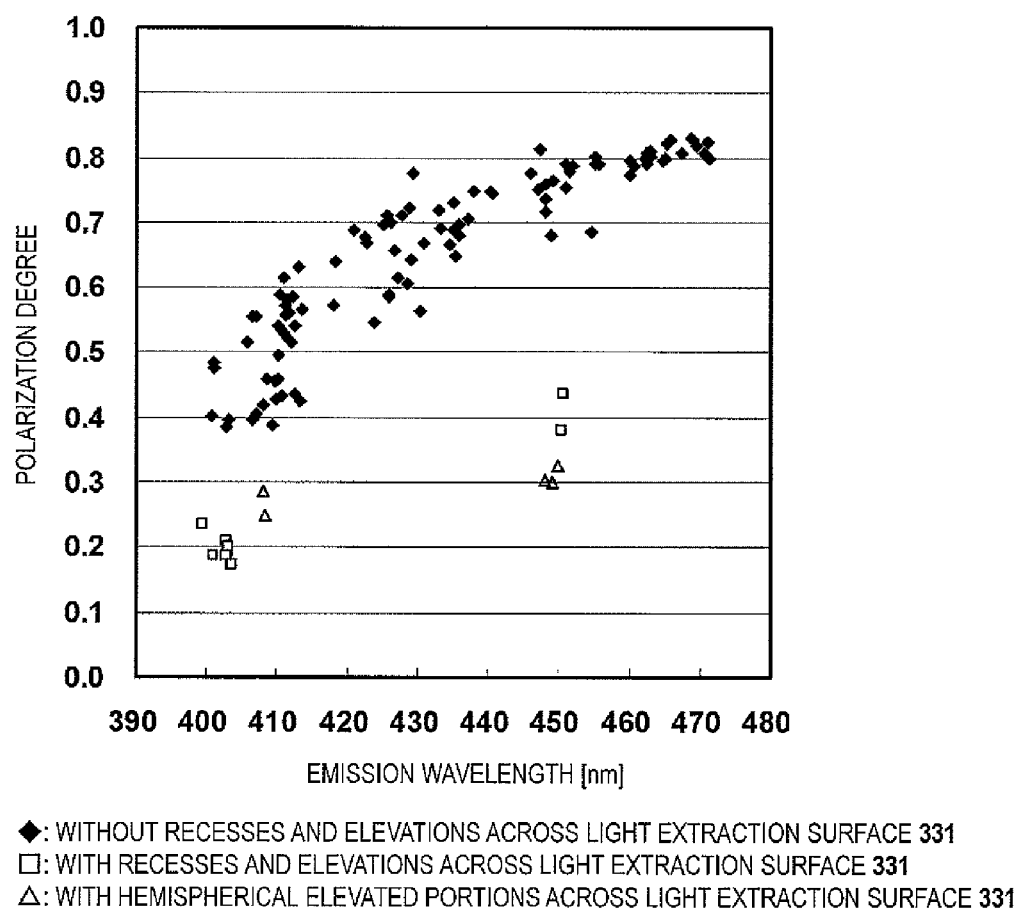
FIG. 29 is a graph of measurement results which illustrates the effect of reducing the polarization degree in the case where the light extraction surface 331 has recesses and elevations.

FIG. 29 shows measurement results as to the polarization degree reducing effect in the case where the light extraction surface has recesses and elevations. Here, measured values are shown in the same graph together with the relationship between the emission wavelength and the polarization degree of the nitride-based semiconductor light-emitting element including an active layer formed on the m-plane which has previously been illustrated in FIG. 4. That is, it can be seen that providing recesses and elevations across the light extraction surface 331 enables reduction of the polarization degree to generally a half.

Figure 30:
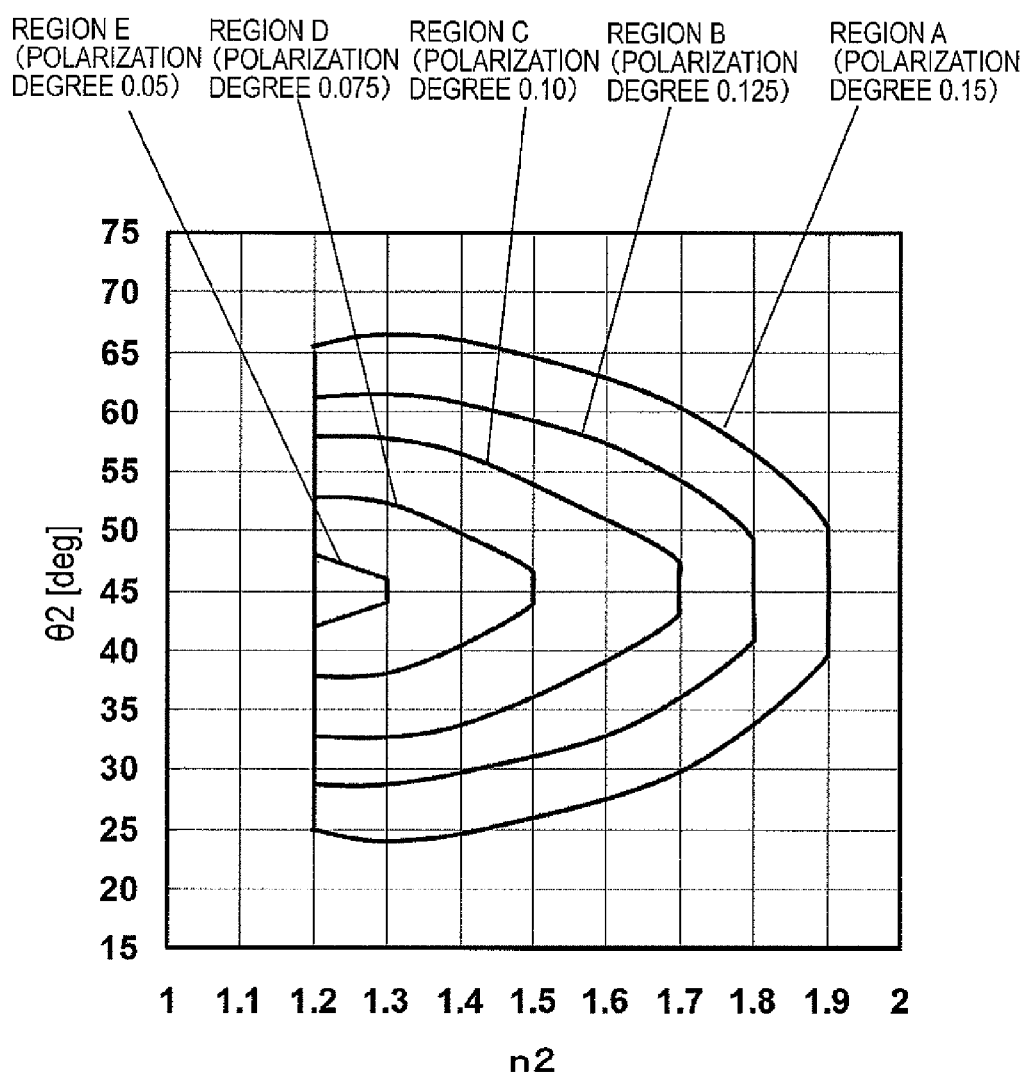
FIG. 30 is a graph showing appropriate ranges of θ2 and n2 in the case where all of the light extraction surfaces in Embodiment 4 are considered.

FIG. 30 is a graph edited from the results of FIG. 29 and the results of FIG. 15, showing appropriate ranges of and n2 in Embodiment 4 for a case where the area occupation ratio R is not less than 0.24 and θ1 is equal to or greater than the critical angle θc. FIG. 30 illustrates the ranges of n2 and θ2 which satisfy the following conditions: the polarization degree is not more than 0.15 (region A); the polarization degree is not more than 0.125 (region B); the polarization degree is not more than 0.1 (region C); the polarization degree is not more than 0.075 (region D); and the polarization degree is not more than 0.05 (region E). Here, the "region" includes the solid line and the entire area enclosed by the solid line. As seen from FIG. 30, θ2 may be a value which is close to 45°, and the value of n2 may be as small as possible.

As seen from the above, providing a polarization degree reducing structure across the light extraction surface 331 enables further reduction of the polarization degree than Embodiment 1.

Next, a manufacturing method of Embodiment 4 is described. The manufacturing method of Embodiment 4 is the same as that of Embodiment 1 except for the method for forming the recesses and elevations 334. Thus, herein, only the method for forming the recesses and elevations 334 is described.

A photoresist is applied over a surface of the substrate 304 in which recesses and elevations are to be formed, and resist patterning is performed using a contact exposure apparatus. Then, recesses and elevations are formed by dry etching with a chlorine gas using the photoresist as a mask. In this process, the conditions are made such that the photoresist is etched away concurrently, whereby the cross-sectional shape of the recesses and elevations in a striped pattern can be configured to have a shape which is approximate to an isosceles triangle. By making the dry etching conditions so as to achieve high chemical reactivity, elevated portions which have a hemispherical cross section as shown in FIG. 25 can be formed.

Figure 31:
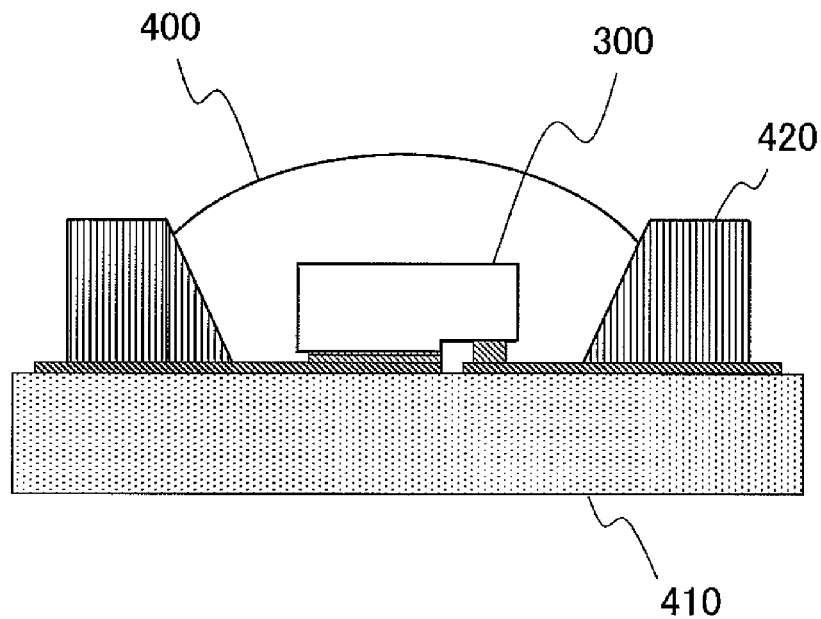
FIG. 31 is a schematic diagram showing an example of a white light source which includes a nitride-based semiconductor light-emitting element 300 of an embodiment.

FIG. 31 is a schematic diagram showing an example of a white light source which includes the nitride-based semiconductor light-emitting element 300 of the embodiment. The light source shown in FIG. 31 includes the nitride-based semiconductor light-emitting element 300 that has the structure shown in FIG. 6 and a resin layer 400 in which a phosphor such as YAG (Yttrium Aluminum Garnet) is dispersed to change the wavelength of the light emitted from the nitride-based semiconductor light-emitting element 300 into a longer one. The nitride-based semiconductor light-emitting element 300 is mounted on a supporting member 410 on which a wiring pattern has been formed. A reflective member 420 is arranged on the supporting member 410 so as to surround the nitride-based semiconductor light-emitting element 300. The resin layer 400 has been formed so as to cover the nitride-based semiconductor light-emitting element 300.

In the embodiments described above, the p-type semiconductor region that is in contact with the p-side electrode 308 is supposed to be made of GaN or AlGaN. However, the p-type semiconductor region may be a layer including In, such as an InGaN layer, for example. In that case, the contact layer that is in contact with the p-side electrode 308 may be made of "$In_{0.2}Ga_{0.8}N$" in which the In mole fraction is 0.2, for example. If In is included in GaN, the bandgap of $Al_aGa_bN$ (where a+b=1, and a≥0 and >0) can be smaller than that of GaN, and therefore, the contact resistance can be reduced as a result. Consequently, the p-type semiconductor region that is in contact with the p-side electrode 308 may be made of an $Al_xIn_yGa_zN$ semiconductor (where x+y+z=1, x≥0, y≥0 and z≥0).

According to the embodiments disclosed in the present application, the polarization degree of extracted light is reduced. Thus, the embodiments are applicable to decorative illumination and lighting devices.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A nitride-based semiconductor light-emitting element comprising:
   a substrate which has a principal surface, a rear surface that is a light extraction surface, and a plurality of lateral surfaces; and
   a nitride semiconductor multilayer structure formed on the principal surface of the substrate, wherein
   the nitride semiconductor multilayer structure includes an active layer which emits polarized light,
   the active layer has a principal surface of an m-plane;
   angle θ is greater than 90°, and
   angle θ2 (mod 180°) is an angle which does not include 0° or 90°,
   where the angle θ is an angle which is formed by at least one of the plurality of lateral surfaces of the substrate with respect to the principal surface of the substrate, and
   the angle θ2 is an absolute value of an angle which is formed by an intersecting line of at least one of the plurality of lateral surfaces of the substrate and the principal surface of the substrate with respect to a [11-20] direction.

2. The nitride-based semiconductor light-emitting element of claim 1, wherein the substrate is an off-cut substrate of not more than 5°.

3. The nitride-based semiconductor light-emitting element of claim 1, wherein a value of (θ−90°) is not less than a value of the angle θ1 which satisfies Formula 9:

$$\theta1 = 51.0 - 21.5 \times n2 \quad \text{(Formula 9)},$$

where n2 is a refractive index of a medium which is in contact with the plurality of lateral surfaces of the substrate.

4. The nitride-based semiconductor light-emitting element of claim 3, wherein the value of (θ−90°) is greater than critical angle θc which is determined by refractive indices n1 and n2, where n1 is a refractive index for light of the substrate.

5. The nitride-based semiconductor light-emitting element of claim 1, wherein planar shapes of the principal and rear surfaces of the substrate are a quadrangular shape, and the plurality of lateral surfaces are four lateral surfaces.

6. The nitride-based semiconductor light-emitting element of claim 5, wherein planar shapes of the principal and rear surfaces of the substrate are a parallelogrammatic shape.

7. The nitride-based semiconductor light-emitting element of claim 5, wherein planar shapes of the principal and rear surfaces of the substrate are a square shape.

8. The nitride-based semiconductor light-emitting element of claim 5, wherein a planar shape of the principal surface and the rear surface of the substrate is a rectangular shape.

9. The nitride-based semiconductor light-emitting element of claim 5, wherein planar shapes of the principal and rear surfaces of the substrate are a rhombic shape.

10. The nitride-based semiconductor light-emitting element of claim 1, wherein the angle θ2 (mod 90°) is not less than 25° and not more than 65°.

11. The nitride-based semiconductor light-emitting element of claim 1, wherein the angle θ2 (mod 90°) is not less than 35° and not more than 55°.

12. The nitride-based semiconductor light-emitting element of claim 1, wherein the angle θ2 (mod 90°) is not less than 40° and not more than 50°.

13. The nitride-based semiconductor light-emitting element of claim 1, wherein the rear surface of the substrate has a plurality of elevated portions.

14. The nitride-based semiconductor light-emitting element of claim 13, wherein the elevated portions have a conical shape or a hemispherical shape and are two-dimensionally arranged across the rear surface of the substrate.

15. The nitride-based semiconductor light-emitting element of claim 13, wherein
   the elevated portions have a striped shape, and
   γ (mod 180°) is not less than 5° and not more than 175° where γ is an absolute value of an angle which is formed between an extending direction of the striped shape and a polarization direction of the polarized light.

16. The nitride-based semiconductor light-emitting element of claim 15, wherein γ (mod 180°) is not less than 30° and not more than 150°.

17. The nitride-based semiconductor light-emitting element of claim 1, wherein
   σ1 (mod 180°) is not less than 85° and not more than 95° where σ1 is an absolute value of an angle formed between a polarization direction of the polarized light and a normal line of the principal surface of the substrate, and
   σ2 (mod 180°) is not less than 85° and not more than 95° where σ2 is an absolute value of an angle formed between the polarization direction of the polarized light and a normal line of the rear surface of the substrate.

18. A light source, comprising the nitride-based semiconductor light-emitting element as set forth in claim 1 and a wavelength converter including a phosphor that converts at least a wavelength of light emitted from the rear surface of the substrate.

* * * * *